US012727384B2

(12) United States Patent
Kho et al.

(10) Patent No.: US 12,727,384 B2
(45) Date of Patent: Sep. 1, 2026

(54) VIBRATION APPARATUS AND SOUND APPARATUS INCLUDING THE SAME

(71) Applicant: LG Display Co., Ltd., Seoul (KR)

(72) Inventors: Yuseon Kho, Paju-si (KR); Jaeyoung Lim, Paju-si (KR); Sooyoun Kim, Paju-si (KR); Yongwoo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 990 days.

(21) Appl. No.: 17/967,781

(22) Filed: Oct. 17, 2022

(65) Prior Publication Data

US 2023/0217827 A1 Jul. 6, 2023

(30) Foreign Application Priority Data

Dec. 31, 2021 (KR) ........................ 10-2021-0194784

(51) Int. Cl.

*H10N 30/20* (2023.01)
*H04R 17/10* (2006.01)
*H10N 30/85* (2023.01)
*H10N 30/87* (2023.01)

(52) U.S. Cl.

CPC ............. *H10N 30/20* (2023.02); *H04R 17/10* (2013.01); *H10N 30/85* (2023.02); *H10N 30/872* (2023.02); *H04R 2499/15* (2013.01)

(58) Field of Classification Search

CPC ...... H10N 30/20; H10N 30/206; H10N 30/85; H10N 30/87; H10N 30/872; B06B 1/0629; H04R 17/00; H04R 17/10

See application file for complete search history.

(56) References Cited

U.S. PATENT DOCUMENTS 4,170,742 A * 10/1979 Itagaki ................. H04R 17/005 310/800
2010/0148627 A1* 6/2010 Funasaka ............... G10K 9/122 310/334
2013/0082567 A1* 4/2013 Funasaka ............... G10K 9/122 310/317
2013/0294201 A1 11/2013 Hajati (Continued)

FOREIGN PATENT DOCUMENTS

CN 104271264 A 1/2015
CN 109068249 A 12/2018

(Continued)

OTHER PUBLICATIONS

Office Action issued in corresponding Chinese Patent Application No. 202211275453.6, dated Jul. 30, 2025. (Note: JP 2013-123150 A was previously cited).

(Continued)

*Primary Examiner* — J. San Martin

(74) *Attorney, Agent, or Firm* — Morgan, Lewis & Bockius LLP

(57) ABSTRACT

A vibration apparatus includes a vibration device. The vibration device includes a vibration portion including a piezoelectric material, a first electrode portion at a first surface of the vibration portion and configured as a plurality of circular patterns, and a second electrode portion at a second surface different from the first surface of the vibration portion and configured as a single electrode, and the vibration device generates an ultrasound wave.

5 Claims, 12 Drawing Sheets

(56) References Cited

U.S. PATENT DOCUMENTS

| | | | | |
|---|---|---|---|---|
| 2020/0007980 | A1 | 1/2020 | Hsueh et al. | |
| 2020/0314551 | A1 | 10/2020 | Kim | |
| 2021/0304722 | A1 | 9/2021 | Kho et al. | |
| 2025/0278153 | A1* | 9/2025 | Kim | G06F 3/043 |

FOREIGN PATENT DOCUMENTS

| | | | |
|---|---|---|---|
| JP | 2013-123150 | A | 6/2013 |
| JP | 2013-128174 | A | 6/2013 |
| KR | 10-2020-0114911 | A | 10/2020 |

OTHER PUBLICATIONS

Office Action dated Dec. 28, 2023 for Japanese Patent Application No. 2022-174221.

Office Action issued in corresponding Korean Patent Application No. 10-2021-0194784, dated Nov. 20, 2025. (Note: JP 2013-123150 A was previously cited).

* cited by examiner

VIBRATION APPARATUS AND SOUND APPARATUS INCLUDING THE SAME

CROSS-REFERENCE TO RELATED APPLICATIONS

This application claims the benefit of Korean Patent Application No. 10-2021-0194784 filed on Dec. 31, 2021, which is hereby incorporated by reference as if fully set forth herein.

BACKGROUND

Technical Field

The present disclosure relates to a vibration apparatus and a sound apparatus including the same.

Discussion of the Related Art

An apparatus includes a separate speaker or sound apparatus providing a sound. When a speaker is disposed in an apparatus, the speaker occupies a space, due to this, the design and spatial disposition of the apparatus are limited.

A speaker applied to the apparatus may be, for example, an actuator including a magnet and a coil. However, when an actuator is applied to the apparatus, a thickness thereof is thickened. Therefore, piezoelectric elements for realizing a thin thickness are attracting much attention.

Because piezoelectric elements have a fragile characteristic, the piezoelectric elements are easily damaged due to an external impact, and due to this, have a problem where reliability is low in sound reproduction. And, when a speaker such as a piezoelectric element or the like is applied to a flexible apparatus, there is a problem where damage occurs due to a fragile characteristic.

Moreover, an ultrasound piezoelectric device having a tetragonal shape has a drawback where it is difficult to control a resonance frequency when using a vibration mode, and moreover, has a drawback where a vibration is relatively weak because an ultrasound vibration is transferred through a vibration plate.

SUMMARY

Accordingly, the inventors have recognized the problems described above and have performed various experiments for implementing a vibration apparatus which may enhance the quality of a sound and a sound pressure level characteristic. Through the various experiments, the inventors have invented a new vibration apparatus and an apparatus including the same, which may enhance the quality of a sound and a resonance control characteristic.

An aspect of the present disclosure is directed to providing a vibration apparatus and an apparatus including the same, in which a manufacturing method is simplified and resonance control is possible.

Accordingly, embodiments of the present disclosure are directed to an apparatus that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a vibration apparatus comprises a vibration device, the vibration device comprises a vibration portion including a piezoelectric material, a first electrode portion at a first surface of the vibration portion and configured as a plurality of circular patterns, and a second electrode portion at a second surface different from the first surface of the vibration portion and configured as a single electrode, and the vibration device generates an ultrasound wave.

In another aspect, a vibration apparatus comprises a vibration device, the vibration device comprises a vibration portion including a piezoelectric material, an ultrasound electrode portion at a first surface of the vibration portion and configured as a plurality of circular patterns, a sound electrode portion configured to surround the ultrasound electrode portion, and a second electrode portion at a second surface different from the first surface of the vibration portion and configured as a single electrode, the vibration device generates a first sound and a second sound, and the first sound is an ultrasound wave, and the second sound has an audible frequency.

In another aspect, a vibration apparatus comprises a vibration device, the vibration device comprises a vibration portion including a piezoelectric material, a first electrode portion having a finger type at a first surface of the vibration portion, a sound electrode portion having a finger type at a second surface different from the first surface of the vibration portion, the first electrode portion comprises a first engraved pattern, the second electrode portion comprises a second engraved pattern, the first engraved pattern and the second engraved pattern configure a plurality of circular patterns, and the vibration device generates an ultrasound wave.

In another aspect, an apparatus comprises a vibration object, a vibration generating apparatus at the vibration object, and a connection member between the vibration object and the vibration generating apparatus, the vibration generating apparatus comprises the vibration apparatus described above.

A vibration apparatus according to an embodiment of the present disclosure may be manufactured as an array type by a simple process, an ultrasound vibration apparatus capable of resonance point control of a large area may be provided, and the vibration apparatus according to an embodiment of the present disclosure may be applied as a large-area display apparatus, an ultrasound generator, a sensor, or the like.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
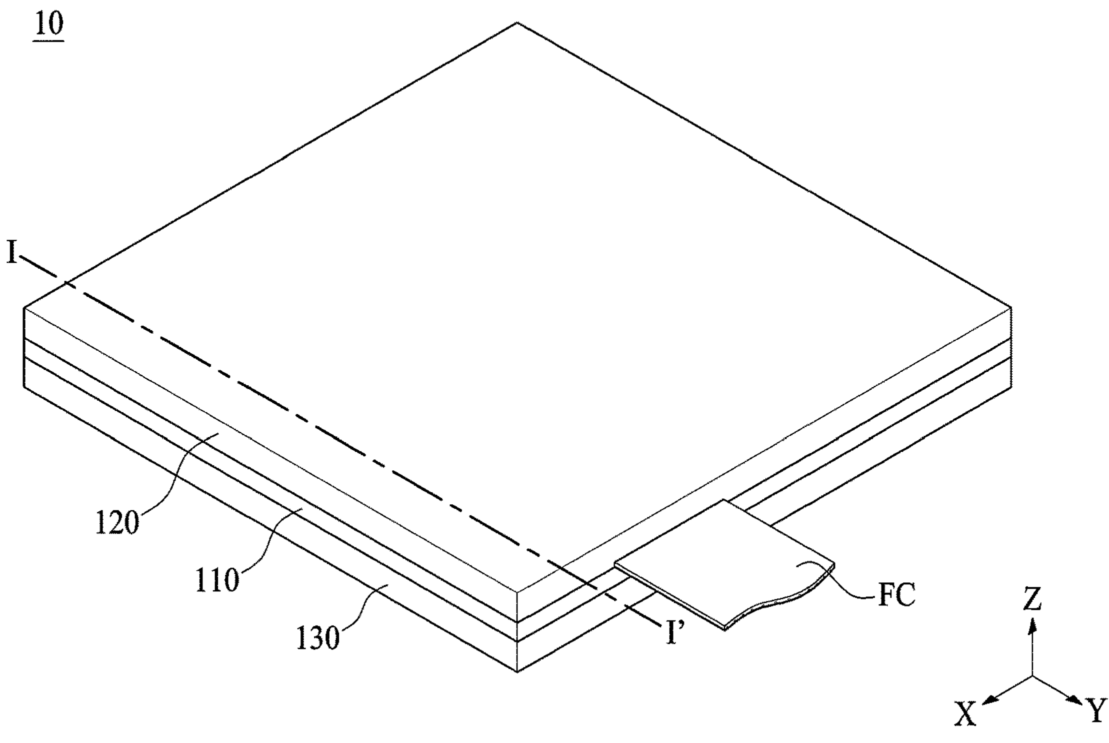
FIG. 1 is a perspective view of a vibration apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Same reference numerals designate same elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When “comprise,” “have,” and “include” described in the present specification are used, another part may be added unless “only” is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, “on,” “over,” “under,” and “next,” one or more other parts may be disposed between the two parts unless a more limiting term, such as “just” or “direct(ly)” is used. In the description of embodiments, when a structure is described as being positioned “on or above” or “under or below” another structure, this description should be construed as including a case in which the structures contact each other as well as a case in which a third structure is disposed therebetween.

In describing a time relationship, for example, when the temporal order is described as, for example, “after,” “subsequent,” “next,” and “before,”, or the like a case that is not continuous may be included unless a more limiting term, such as “just,” “immediate(ly),” or “direct(ly)” is used.

It will be understood that, although the terms “first,” “second,” etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms “first,” “second,” “A,” “B,” “(a),” “(b),” etc. may be used. These terms are intended to identify the corresponding elements from the other elements, and basis, order, or number of the corresponding elements should not be limited by these terms. In case of the expression that an element is “connected,” “coupled,” or “adhered” to another element or layer, the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. Also, for convenience of description, a scale, size and thickness of each of elements illustrated in the accompanying drawings differs from a real scale, and thus, embodiments of the present disclosure are not limited to a scale illustrated in the drawings.

Figure 2:
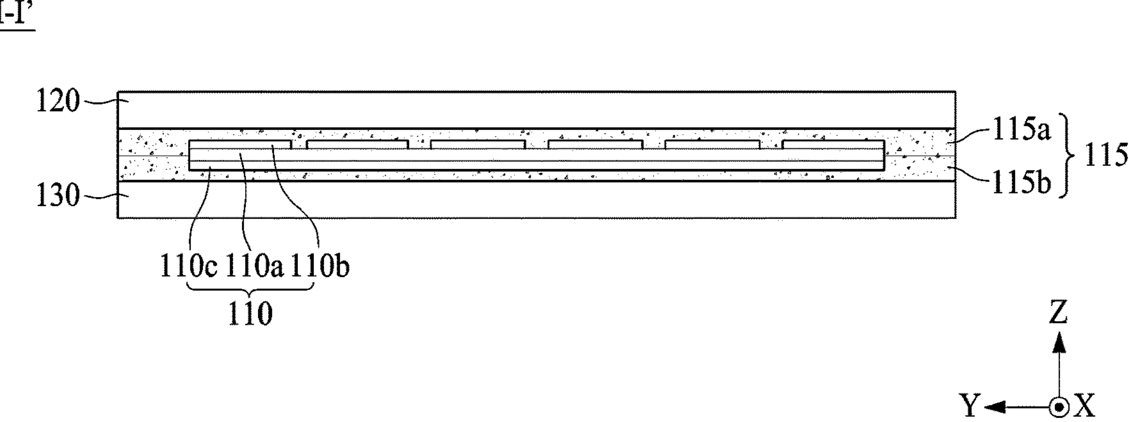
FIG. 2 is a cross-sectional view taken along line I-I' of FIG. 1.

FIG. 1 is a perspective view of a vibration apparatus according to an embodiment of the present disclosure. FIG. 2 is a cross-sectional view taken along line I-I' of FIG. 1.

With reference to FIGS. 1 and 2, a vibration apparatus 10 according to an embodiment of the present disclosure may include a vibration device 110, a first cover member 120 disposed at a first surface of the vibration device 110, and a second cover member 130 disposed at a second surface which is opposite to (or different from) the first surface of the vibration device 110.

The vibration device 110 may be a vibration structure, a vibration generator, a vibration module, an actuator, an exciter, a vibration film, a film actuator, a film exciter, or a sound generator, but embodiments of the present disclosure are not limited thereto.

The vibration device 110 may include a piezoelectric material having a piezoelectric characteristic. The vibration device 110 may be displaced or vibrated (or driven) as the piezoelectric material alternately repeats contraction and expansion by a piezoelectric effect of the piezoelectric material according to a first vibration driving signal (or a first sound signal). For example, the vibration device 110 may output or generate a first sound wave based on a displacement or a vibration (or a driving) of the piezoelectric material. For example, a vibration of the vibration device 110 may be used as a vibration for a haptic feedback reacting on a touch (for example, a user touch).

The vibration device 110 according to an embodiment of the present disclosure may include a vibration portion **110*a* including a piezoelectric material, a first electrode portion 110*b* disposed at a first surface of the vibration portion 110*a*, and a second electrode portion 110*c* disposed at a second surface which is opposite to or different from the first surface of the vibration portion 110*a***.

The vibration portion (or a first vibration portion) **110*a*** may be referred to as a vibration layer, a piezoelectric layer, a piezoelectric material layer, an electroactive layer, a piezoelectric vibration portion, a piezoelectric material portion, an electroactive portion, an inorganic material layer, or an inorganic material portion, or the like, but embodiments of the present disclosure are not limited thereto.

The vibration portion **110*a*** may be configured as a ceramic-based material for generating a relatively high vibration, or may be configured as a piezoelectric ceramic having a perovskite-based crystalline structure. The perovskite crystalline structure may have a piezoelectric effect and an inverse piezoelectric effect and may be a plate-shaped structure having orientation. The perovskite crystalline structure may be represented by a chemical formula "$ABO_3$". In the chemical formula, "A" may include a divalent metal element, and "B" may include a tetravalent metal element. As an embodiment of the present disclosure, in the chemical formula "$ABO_3$", "A", and "B" may be cations, and "O" may be anions. For example, the perovskite crystalline structure may include at least one or more of $PbTiO_3$, $PbZrO_3$, $PbZrTiO_3$, $BaTiO_3$, and $SrTiO_3$, but embodiments of the present disclosure are not limited thereto.

The vibration portion **110*a*** according to an embodiment of the present disclosure may include one or more of lead (Pb), zirconium (Zr), titanium (Ti), zinc (Zn), nickel (Ni), and niobium (Nb), but embodiments of the present disclosure are not limited thereto.

The vibration portion **110*a* according to another embodiment of the present disclosure may include a lead zirconate titanate (PZT)-based material including lead (Pb), zirconium (Zr), and titanium (Ti) or may include a lead zirconate nickel niobate (PZNN)-based material including lead (Pb), zirconium (Zr), nickel (Ni), and niobium (Nb), but embodiments of the present disclosure are not limited thereto. Or, the vibration portion 110*a*** may include at least one or more of $CaTiO_3$, $BaTiO_3$, and $SrTiO_3$ without Pb, but embodiments of the present disclosure are not limited thereto.

The vibration portion **110*a* according to another embodiment of the present disclosure may have a piezoelectric deformation coefficient "$d_{33}$" of 1,000 pC/N or more along a thickness direction Z. By the vibration portion 110*a* has a high piezoelectric deformation coefficient "$d_{33}$", the vibration portion 110*a* may be applied to a vibration object (or a vibration member) having a large size, or may be applied to implement a vibration apparatus having a sufficient vibration characteristic or piezoelectric characteristic. For example, the vibration portion 110*a*** may include a PZT-based material ($PbZrTiO_3$) as a main component and may include a softener dopant material doped into "A" site (Pb) and a relaxor ferroelectric material doped into "B" site (ZrTi).

The softener dopant material may enhance a piezoelectric characteristic and a dielectric characteristic of the vibration portion **110*a*, and for example, may increase the piezoelectric deformation coefficient "$d_{33}$" of the vibration portion 110*a***. When the softener dopant material includes a monovalent element "+1", a piezoelectric characteristic and a dielectric characteristic may be reduced. For example, when the softener dopant material is configured as kalium (K) and rubidium (Rb), a piezoelectric characteristic and a dielectric characteristic may be reduced. Therefore, by performing various experiments, the inventors of the present disclosure have recognized that the softener dopant material should configure a dyad element "+2" to a triad element "+3", for enhancing a piezoelectric characteristic and a dielectric characteristic. The softener dopant material according to an embodiment of the present disclosure may include a dyad element "+2" to a triad element "+3". Morphotropic phase boundary (MPB) may be configured by adding the softener dopant material to the PZT-based material ($PbZrTiO_3$), and thus, a piezoelectric characteristic and a dielectric characteristic may be enhanced. For example, the softener dopant material may include strontium (Sr), barium (Ba), lanthanum (La), neodymium (Nd), calcium (Ca), yttrium (Y), erbium (Er), or ytterbium (Yb). For example, ions ($Sr^{2+}$, $Ba^{2+}$, $La^{2+}$, $Nd^{3+}$, $Ca^{2+}$, $Y^{3+}$, $Er^{3+}$, $Yb^{3+}$) of the softener dopant material doped into the PZT-based material ($PbZrTiO_3$) may substitute a portion of lead (Pb) in the PZT-based material ($PbZrTiO_3$), and a substitution rate thereof may be about 2 mol % to about 20 mol %. For example, when the substitution rate is less than 2 mol % or greater than 20 mol %, a perovskite crystal structure may be broken, and thus, an electromechanical coupling coefficient "kP" and the piezoelectric deformation coefficient "$d_{33}$" may decrease. When the softener dopant material is substituted, the MPB may be configured, and a piezoelectric characteristic and a dielectric characteristic may be high in the MPB, thereby implementing a vibration apparatus having a high piezoelectric characteristic and a high dielectric characteristic.

According to an embodiment of the present disclosure, the relaxor ferroelectric material doped into the PZT-based material ($PbZrTiO_3$) may enhance an electric deformation characteristic of the vibration portion 110*a*. The relaxor ferroelectric material according to an embodiment of the present disclosure may include a lead magnesium niobate (PMN)-based material or a lead nickel niobate (PNN)-based material, but embodiments of the present disclosure are not limited thereto. The PMN-based material may include Pb, Mg, and Nb, and for example, may include $Pb(Mg, Nb)O_3$. The PNN-based material may include Pb, Ni, and Nb, and for example, may include $Pb(Ni, Nb)O_3$. For example, the relaxor ferroelectric material doped into the PZT-based material ($PbZrTiO_3$) may substitute a portion of each of zirconium (Zr) and titanium (Ti) in the PZT-based material ($PbZrTiO_3$), and a substitution rate thereof may be about 5 mol % to about 25 mol %. For example, when the substitution rate is less than 5 mol % or greater than 25 mol %, a perovskite crystal structure may be broken, and thus, the electromechanical coupling coefficient "kP" and the piezoelectric deformation coefficient "$d_{33}$" may decrease.

According to an embodiment of the present disclosure, the vibration portion 110*a* may further include a donor material doped into "B" site (ZrTi) of the PZT-based material ($PbZrTiO_3$), in order to more enhance a piezoelectric coefficient. For example, the donor material doped into the "B" site (ZrTi) may include a tetrad element "+4" or a hexad element "+6". For example, the donor material doped into the "B" site (ZrTi) may include tellurium (Te), germanium (Ge), uranium (U), bismuth (Bi), niobium (Nb), tantalum (Ta), antimony (Sb), or tungsten (W).

The first electrode portion 110*b* may be disposed at a first surface (or an upper surface) of the vibration portion 110*a*. For example, the first electrode portion 110*b* may be electrically connected to the first surface of the vibration portion 110*a*. For example, the first electrode portion 110*b* may be directly and electrically connected to the first surface of the vibration portion 110*a*. The first electrode portion 110*b* may be disposed between the vibration portion 110*a* and the first cover member 120. According to another embodiment of the present disclosure, the first electrode portion 110*b* may include at least a pair or more of finger type electrodes parallel to each other over the first surface of the vibration portion 110*a*. The first electrode portion 110*b* having a finger type may be connected to a pad portion which is positioned at one periphery of the first surface of the vibration portion 110*a*.

The first electrode portion 110*b* according to an embodiment of the present disclosure may be formed of a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), silver (Ag), molybdenum (Mo), Mg, or the like, or an alloy thereof, but embodiments of the present disclosure are not limited thereto.

The second electrode portion 110*c* may be disposed at the second surface (or a rear surface) of the vibration portion 110*a* and may overlap the first electrode portion 110*b*. For example, the second electrode portion 110*c* may be electrically connected to the second surface of the vibration portion 110*a*. For example, the second electrode portion 110*c* may be directly and electrically connected to the second surface of the vibration portion 110*a*. For example, the second electrode portion 110*c* may be disposed between the vibration portion 110*a* and the second cover member 130. For example, the second electrode portion 110*c* may have a one-body electrode type (or a single electrode type) disposed at the whole second surface of the vibration portion 110*a*. For example, the second electrode portion 110*c* may have the same shape as the vibration portion 110*a*, but embodiments of the present disclosure are not limited thereto.

The second electrode portion 110*c* according to an embodiment of the present disclosure may be formed of a transparent conductive material, a semitransparent conductive material, or an opaque conductive material. For example, the second electrode portion 110*c* may be formed of the same material as the first electrode portion 110*b*, but embodiments of the present disclosure are not limited thereto. As another embodiment of the present disclosure, the second electrode portion 110*c* may be formed of a different material than the first electrode portion 110*b*.

The vibration apparatus 10 according to an embodiment of the present disclosure may further include an adhesive layer 115 which is disposed between the first cover member 120 and the second cover member 130 and surrounds the vibration device 110.

The adhesive layer 115 may opposite-bond the first cover member 120 to the second cover member 130 with the vibration portion 110*a* therebetween. The adhesive layer 115 may be disposed in the other region, except the vibration device 110, of a region between the first cover member 120 and the second cover member 130.

The adhesive layer 115 according to an embodiment of the present disclosure may include a first adhesive layer 115*a* disposed at a second surface (or a rear surface) of the first cover member 120 and a second adhesive layer 115*b* disposed at a first surface (or an upper surface) of the second cover member 130. The first adhesive layer 115*a* and the second adhesive layer 115*b* may be coupled or adhered to each other between the first cover member 120 and the second cover member 130, and thus, may be implemented as one adhesive layer. The first adhesive layer 115*a* or the second adhesive layer 115*b* may be omitted.

Each of the first and second adhesive layers 115*a* and 115*b* may include an electric insulating material. For example, the electric insulating material may have adhesiveness and may include a material capable of compression and decompression. For example, one or more of the first and second adhesive layers 115*a* and 115*b* may include an epoxy resin, an acrylic resin, a silicone resin, or a urethane resin, but embodiments of the present disclosure are not limited thereto.

The first cover member 120 may be coupled or connected to the first surface (or the first electrode portion 110*b*) of the vibration device 110 by a laminating process using the first adhesive layer 115*a*. The second cover member 130 may be coupled or connected to the second surface (or the second electrode portion 110*c*) of the vibration device 110 by a laminating process using the second adhesive layer 115*b*.

The vibration apparatus 10 according to an embodiment of the present disclosure may further include a flexible cable FC. The flexible cable FC may be electrically connected to the vibration device 110 and may be electrically connected to the pad portion of the vibration device 110. Accordingly, the flexible cable FC may supply a vibration driving signal to a corresponding pad portion. The flexible cable FC according to an embodiment of the present disclosure may be a flexible printed circuit cable or a flexible flat cable, but embodiments of the present disclosure are not limited thereto.

Figure 3A:
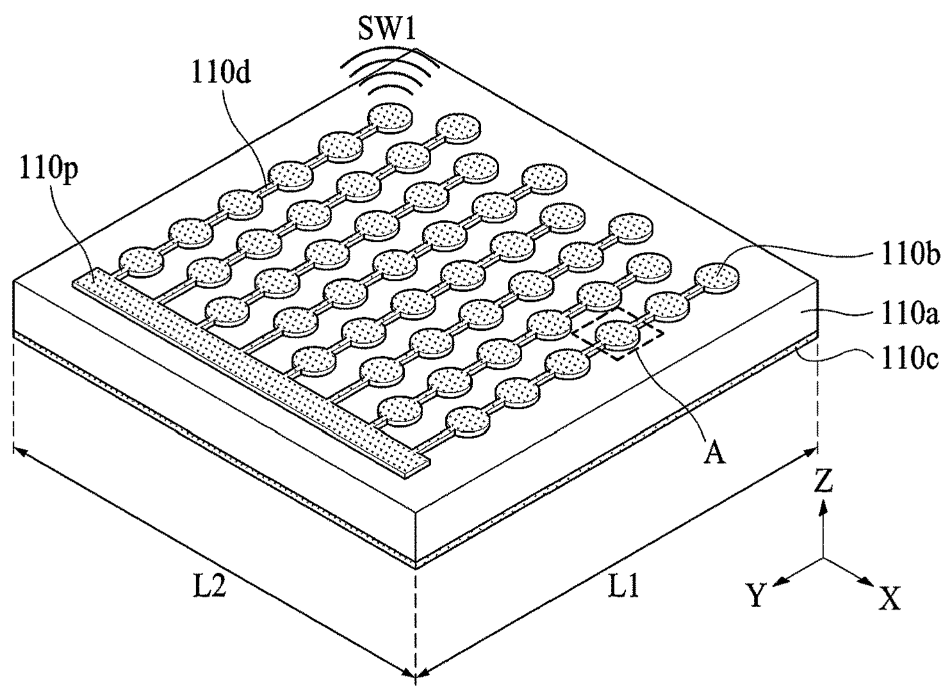
FIG. 3A is a perspective view of a vibration apparatus according to an embodiment of the present disclosure.
Figure 3B:
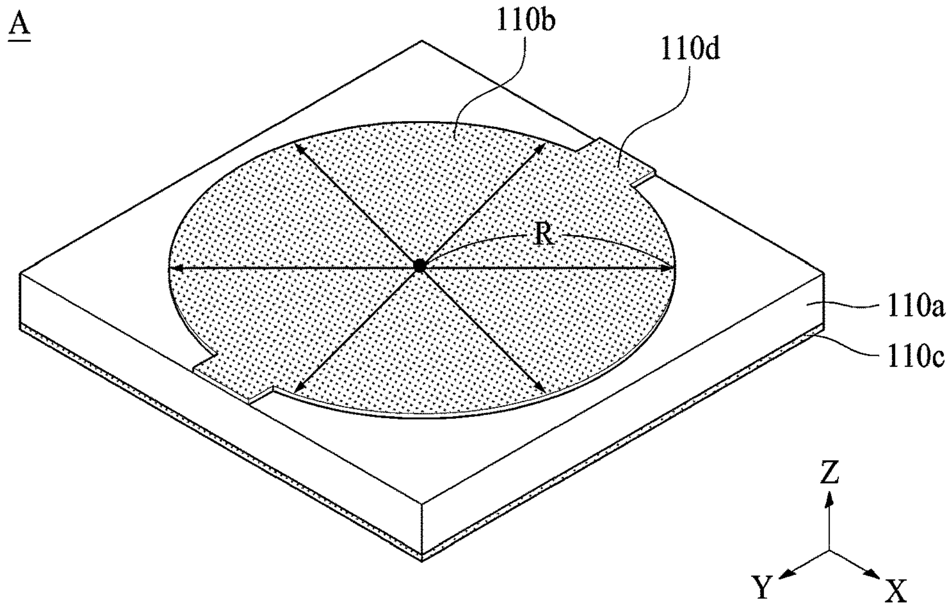
FIG. 3B illustrates a region A of FIG. 3A.
Figure 4:
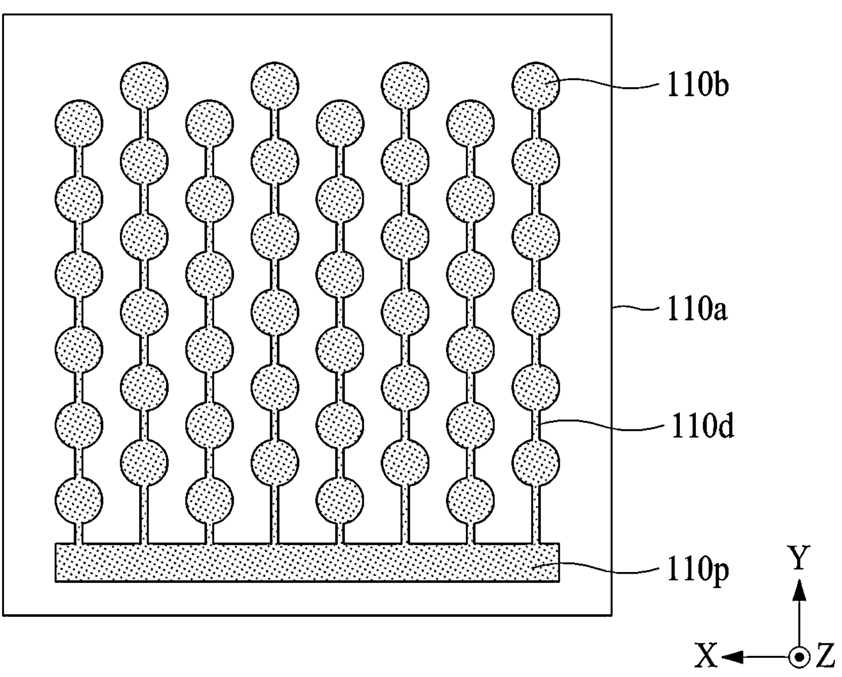
FIG. 4 is a plan view of a vibration apparatus according to an embodiment of the present disclosure.

FIG. 3A is a perspective view of a vibration apparatus according to an embodiment of the present disclosure. FIG. 3B illustrates a region A of FIG. 3A. FIG. 4 is a plan view of a vibration apparatus according to an embodiment of the present disclosure.

With reference to FIGS. 3A, 3B, and 4, a vibration device 110 of the vibration apparatus according to an embodiment of the present disclosure may include a vibration portion 110*a*, a first electrode portion 110*b* disposed at an upper surface or a first surface of the vibration portion 110*a*, a line portion 110*d* connecting the first electrode portion 110*b*, a pad portion 110*p* provided at one side and the first surface of the vibration portion 110*a*, and a second electrode portion 110*c* disposed at a second surface which is opposite to (or different from) the first surface of the vibration portion 110*a*.

The vibration apparatus according to an embodiment of the present disclosure may generate a first sound wave SW1 at the first electrode portion 110*b*, and the first sound wave SW1 may have an audible frequency or a frequency of an ultrasound band. For example, the first sound wave SW1 may have a frequency of 200 Hz (hertz) to 100 kHz band or a frequency of 20 kHz to 10 MHz band. However, a frequency band of the first sound wave SW1 is not limited thereto.

The first electrode portion 110*b* of the vibration apparatus according to an embodiment of the present disclosure may be disposed at an upper portion or the first surface of the vibration portion 110*a*. The first electrode portion 110*b* according to an embodiment of the present disclosure may be provided in plurality at an upper portion or the first surface of the vibration portion 110*a*. Each of the plurality of first electrode portions 110*b* may be a circular pattern electrode and may be arranged as an array type. Addition, in the vibration apparatus according to an embodiment of the present disclosure, each of the plurality of plurality of first electrode portions 110*b* disposed at the upper portion or the first surface of the vibration portion 110*a* may be a circular pattern electrode and may be arranged as an array type, and the vibration device 110 may include one vibration portion 110*a*, the plurality of first electrode portion 110*b* disposed at the upper portion or the first surface of the vibration portion 110*a*, and the line portion 110*d* connected between the plurality of first electrode portions 110*b*. Therefore, the vibration device 110 may be configured as one vibration apparatus physically, but each of the plurality of first electrode portion 110*b* which is a circular pattern electrode and is arranged as an array type may be implemented to be recognized as a plurality of vibration devices or vibration generators, which have one resonance point by limiting (or defining) an active region or a vibration region of the vibration portion 110*a* as a circular pattern region of each of the plurality of first electrode portion 110*b*.

The line portion 110*d* may be connected between the plurality of first electrode portions 110*b*. For example, the line part 110*d* may be configured to be connected between two adjacent first electrode parts 110*b* along a second direction Y. Thus, the plurality of first electrode portions 110*b* arranged along a second direction Y may be connected to each other through the line portion 110*d*.

The pad portion 110*p* may be provided at one side and the first surface of the vibration portion 110*a* and may be commonly connected to the plurality of first electrode portions 110*b* through the line portion 110*d*. The line portion 110*d* may be connected between the plurality of first electrode portions 110*b* and may be connected between some of the plurality of first electrode portions 110*b* and the pad portion 110*p*.

As illustrated in FIG. 3B, each of the plurality of first electrode portion 110*b* may be configured to have a circular pattern where a radius R or a distance from a center portion or a middle portion of the corresponding first electrode portion 110*b* to an edge of the corresponding first electrode portion 110*b* is constant, and thus, a resonance frequency of the vibration apparatus (or the vibration device) may be controlled to be constant. But embodiments are not limited thereto. For example, a radius R of a length of each of the plurality of first electrode portion 110*b* may be various. For example, a radius R or a length of at least some of the plurality of first electrode portion 110*b* may be constant.

Moreover, according to an embodiment of the present disclosure, a resonance frequency "f" of the vibration apparatus (or the vibration device) may be inversely proportional to the radius R of the first electrode portion 110*b*.

According to an embodiment of the present disclosure, the resonance frequency "f" may be determined as expressed in the following Equation 1 or Equation 2.

$$f_1 \propto \frac{1}{2L}\sqrt{\frac{F}{m}} \quad \text{[Equation 1]}$$

$$f_1 \propto \frac{1}{2L}\sqrt{\frac{F}{k}} \quad \text{[Equation 2]}$$

In Equation 1 and Equation 2, L may denote a length of the vibration device, m may denote a unit mass of the vibration device, F may denote a tension of the vibration device, and k may denote stiffness of the vibration device.

According to an embodiment of the present disclosure, the vibration device 110 including the plurality of first electrode portion 110*b* disposed in an array type having a circular electrode pattern may be implemented so that a length of one first electrode portion 110*b* generating a resonance frequency is recognized as a length of the vibration device in Equation 1. Therefore, like that a resonance frequency is inversely proportional to a length of the vibration device in Equation 1, a resonance frequency of the vibration apparatus according to an embodiment of the present disclosure may be inversely proportional to a radius of the first electrode portion 110*b*. Addition, as expressed in Equation 1, a resonance frequency of the vibration apparatus may be inversely proportional to a first length L1 of the vibration device 110 along a first direction X or a second length L2 along a second direction Y. Based on the arrangement of the plurality of first electrode portion 110*b* including a circular pattern, the vibration apparatus according to an embodiment of the present disclosure may realize an effect which is similar to or the same as the arrangement of a plurality of piezoelectric ceramics or piezoelectric devices.

Moreover, the vibration apparatus according to an embodiment of the present disclosure may output a sound wave in a forward direction of an apparatus by the plurality of first electrode portion 110*b*, may be applied as a large-area ultrasound generator or a large-area ultrasound haptic display based on a beamforming effect by constructive interference caused by an array structure of the plurality of first electrode portions 110*b* arranged in row and column, and may be applied as a large-area display apparatus, an ultrasound generator, a sensor, or the like.

Figure 5:
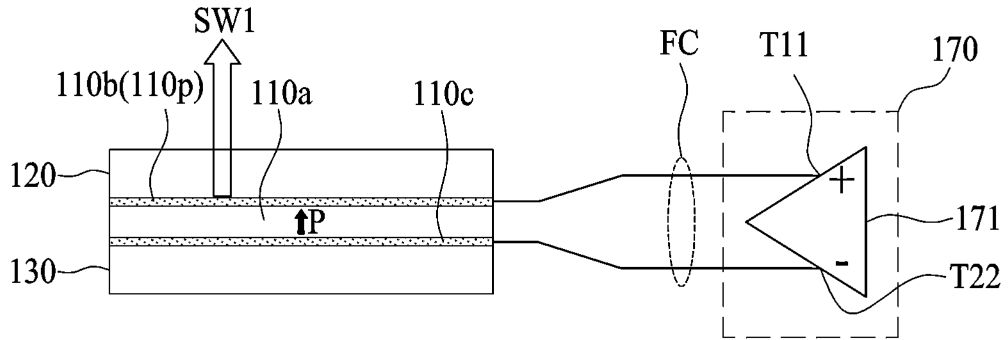
FIG. 5 illustrates a vibration driving circuit of a vibration apparatus according to an embodiment of the present disclosure.

FIG. 5 illustrates a vibration driving circuit of a vibration apparatus according to an embodiment of the present disclosure.

With reference to FIG. 5, the vibration apparatus according to an embodiment of the present disclosure may further include a vibration driving circuit 170.

The vibration driving circuit 170 may be electrically connected to a vibration portion 110*a* through a flexible cable FC. The vibration driving circuit 170 according to an embodiment of the present disclosure may generate a first vibration driving signal for generating a first sound wave SW1 based on a vibration of a vibration device and may supply the generated first vibration driving signal to the vibration device.

The vibration driving circuit 170 according to an embodiment of the present disclosure may include a first amplifier 171 connected to the vibration device.

The first amplifier (or a first signal generating circuit) 171 may generate a first vibration driving signal in an AC type having a first polarity signal and a second polarity signal based on a sound source. The first amplifier 171 according to an embodiment of the present disclosure may include a first output terminal T11, which outputs the first polarity signal of the first vibration driving signal, and a second output terminal T12 which outputs the second polarity signal of the first vibration driving signal.

The vibration portions 110*a* configured in the vibration device may have a polarization direction P from a second electrode portion 110*c* to a first electrode portion 110*b*.

The first polarity signal of the first vibration driving signal output from the first output terminal T11 of the first amplifier 171 may be supplied to a pad portion 110*p* configured in the vibration device through the flexible cable FC, and then may be supplied to the plurality of first electrode portion 110*b* electrically connected to the pad portion 110*p*. The second polarity signal of the first vibration driving signal output from the second output terminal T22 of the first amplifier 171 may be supplied to the second electrode portion 110*c* configured in the vibration device through the flexible cable FC.

The vibration portions 110*a* configured in the vibration device illustrated in FIG. 5 may have a polarization direction P from the second electrode portion 110*c* to the first electrode portion 110*b*. The first polarity signal of the first vibration driving signal may be supplied to the first electrode portion 110*b* of the vibration device, and the second polarity signal of the first vibration driving signal may be supplied to the second electrode portion 110*c* of the vibration device.

Figure 6:
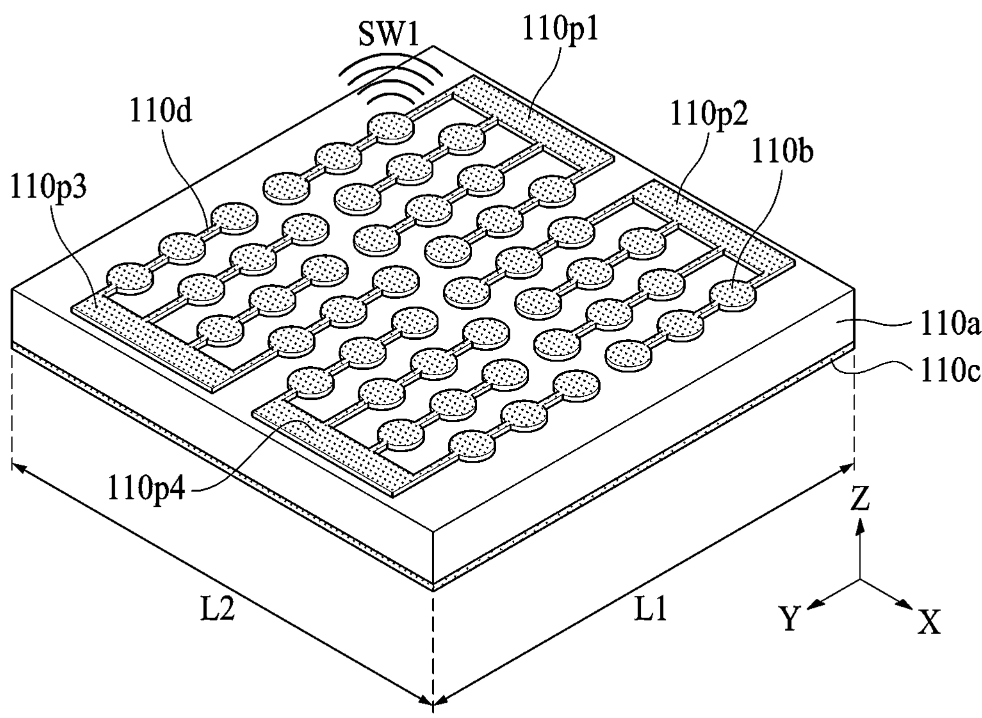
FIG. 6 is a perspective view of a vibration apparatus according to another embodiment of the present disclosure.

FIG. 6 is a perspective view of a vibration apparatus according to another embodiment of the present disclosure.

Figure 7:
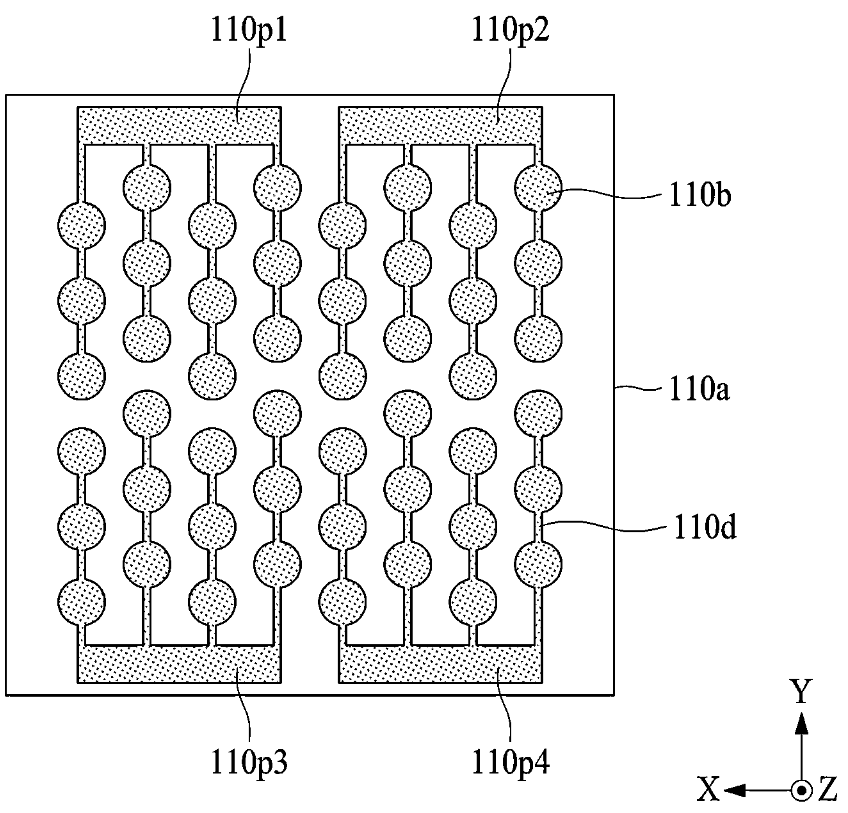
FIG. 7 is a plan view of a vibration apparatus according to another embodiment of the present disclosure.

FIG. 7 is a plan view of a vibration apparatus according to another embodiment of the present disclosure.

With reference to FIGS. 6 and 7, a vibration device of the vibration apparatus according to another embodiment of the present disclosure may include a vibration portion 110*a*, a plurality of first electrode portions 110*b* disposed at an upper surface or a first surface of the vibration portion 110*a*, a line portion 110*d* connecting a plurality of first electrode portions 110*b*, a pad portion 110*p*1 to 110*p*4 provided at the upper surface or the first surface of the vibration portion 110*a*, and a second electrode portion 110*c* disposed at a second surface which is opposite to (or different from) the first surface of the vibration portion 110*a*. Addition, a first electrode portion 110*b* and a pad portion 110*p*1 to 110*p*4 of the vibration device of the vibration apparatus according to another embodiment of the present disclosure may be disposed at each of a first region, a second region, a third region, and a fourth region, which are arranged at the first surface or the upper surface of the vibration portion 110*a*. For example, the first electrode portions 110*b* disposed in each of the first to fourth regions may be electrically disconnected from one another.

In FIG. 6, the first region may be a region including an upper corner, the second region may be a region including a right corner, the third region may be a region including a left corner, and the fourth region may be a region including a lower corner.

According to another embodiment of the present disclosure, the first electrode portion 110*b* may include at least a pair or more of finger type electrodes parallel to each other over a first surface of the vibration portion 110*a*, and the first electrode portion 110*b* having the finger type may be provided in plurality, and for example, may be arranged to correspond to each of the first region, the second region, the third region, and the fourth region, which are arranged at the first surface or the upper surface of the vibration portion 110*a*. The first electrode portions 110*b* may be configured to independently drive only a region which is selected by an electrical signal applied to a first pad portion 110*p*1, a second pad portion 110*p*2, a third pad portion 110*p*3, and a fourth pad portion 110*p*4. For example, an electrical signal applied to the first pad portion 110*p*1, the second pad portion 110*p*2, the third pad portion 110*p*3, and the fourth pad portion 110*p*4 may be applied in synchronization with an electrical signal applied to a second electrode portion 110*c*, and such the electrical signal may be controlled through a flexible cable FC and a first amplifier 171.

According to an embodiment of the present disclosure, the first to fourth regions may simultaneously operate, the first to third regions may be turned on (or activated), and the fourth region may be turned off (or inactivated). When the first and second regions are turned on, the third and fourth regions may be turned off, and when the first region is turned on, the second to fourth regions may be turned off. The embodiments are not limited thereto. For example, the vibration portion 110*a* may comprise at least two regions located at any position of the upper surface of the vibration portion 110*a*. And, the first electrode portions 110*b* disposed in each of the at least two regions may be electrically disconnected from one another, and may be driven independently.

The first electrode portion 110*b* of the vibration apparatus according to another embodiment of the present disclosure may be disposed at an upper portion or the first surface of the vibration portion 110*a*. The first electrode portion 110*b* according to an embodiment of the present disclosure may be provided in plurality at an upper portion or the first surface of the vibration portion 110*a*. Each of the plurality of first electrode portions 110*b* may be a circular pattern electrode and may be arranged as an array type. Addition, in the vibration apparatus according to an embodiment of the present disclosure, each of the plurality of plurality of first electrode portions 110*b* disposed at the upper portion or the first surface of the vibration portion 110*a* may be a circular pattern electrode and may be arranged as an array type, and the vibration device 110 may include one vibration portion 110*a*, the plurality of first electrode portion 110*b* disposed at the upper portion or the first surface of the vibration portion 110*a*, and the line portion 110*d* connected between the plurality of first electrode portions 110*b*. Therefore, the vibration device 110 may be configured as one vibration apparatus physically, but each of the plurality of first electrode portion 110*b* which is a circular pattern electrode and is arranged as an array type may be implemented to be recognized as a plurality of vibration devices or vibration generators, which have one resonance point by limiting (or defining) an active region or a vibration region of the vibration portion 110*a* as a circular pattern region of each of the plurality of first electrode portion 110*b*.

Based on the arrangement of the plurality of first electrode portion 110*b* including a circular pattern, the vibration apparatus according to an embodiment of the present disclosure may realize an effect which is similar to or the same as the arrangement of a plurality of piezoelectric ceramics or piezoelectric devices.

Moreover, the vibration apparatus according to an embodiment of the present disclosure may output a sound wave in a forward direction of an apparatus by the plurality of first electrode portion 110*b*, may be applied as a large-area ultrasound generator or a large-area ultrasound haptic display based on a beamforming effect by constructive interference caused by an array structure of the plurality of first electrode portions 110*b* arranged in row and column, and may be applied as a large-area display apparatus, an ultrasound generator, a sensor, or the like.

According to an embodiment of the present disclosure, the vibration device 110 including the plurality of first electrode portion 110*b* disposed in an array type having a circular electrode pattern may be implemented so that a length of one first electrode portion 110*b* generating a resonance frequency is recognized as a length of the vibration device in Equation 1, like that a resonance frequency is inversely proportional to a length of the vibration device in Equation 1, a resonance frequency of the vibration apparatus according to an embodiment of the present disclosure may be inversely proportional to a radius of the first electrode portion 110*b*. Addition, as expressed in Equation 1, a resonance frequency of the vibration apparatus may be inversely proportional to a first length L1 of the vibration device 110 along a first direction X or a second length L2 along a second direction Y.

For example, the first sound wave SW1 may be a sound wave in the ultrasonic band or a haptic feedback signal.

The line portion 110*d* may be connected between the plurality of first electrode portions 110*b* in each of the first to fourth regions. For example, the line part 110*d* may be configured to be connected between two adjacent first electrode parts 110*b* along a second direction Y in each of the first to fourth regions. Thus, the plurality of first electrode portions 110*b* arranged along a second direction Y may be connected to each other through the line portion 110*d* in each of the first to fourth regions.

The first pad portion 110*p*1 may be provided at the first region of the vibration portion 110*a* and may be commonly connected to the plurality of first electrode portions 110*b* through the line portion 110*d* in the first region of the vibration portion 110*a*. In the first region of the vibration portion 110*a*, the line portion 110*d* may be connected between the plurality of first electrode portions 110*b* and may be connected between some of the plurality of first electrode portions 110*b* and the first pad portion 110*p*1.

The second pad portion 110*p*2 may be provided at the second region of the vibration portion 110*a* and may be commonly connected to the plurality of first electrode portions 110*b* through the line portion 110*d* in the second region of the vibration portion 110*a*. In the second region of the vibration portion 110*a*, the line portion 110*d* may be connected between the plurality of first electrode portions 110*b* and may be connected between some of the plurality of first electrode portions 110*b* and the second pad portion 110*p*2.

The third pad portion 110*p*3 may be provided at the third region of the vibration portion 110*a* and may be commonly connected to the plurality of first electrode portions 110*b* through the line portion 110*d* in the third region of the vibration portion 110*a*. In the third region of the vibration portion 110*a*, the line portion 110*d* may be connected between the plurality of first electrode portions 110*b* and may be connected between some of the plurality of first electrode portions 110*b* and the third pad portion 110*p*3.

The fourth pad portion 110*p*4 may be provided at the fourth region of the vibration portion 110*a* and may be commonly connected to the plurality of first electrode portions 110*b* through the line portion 110*d* in the fourth region of the vibration portion 110*a*. In the fourth region of the vibration portion 110*a*, the line portion 110*d* may be connected between the plurality of first electrode portions 110*b* and may be connected between some of the plurality of first electrode portions 110*b* and the fourth pad portion 110*p*4.

The vibration portion 110*a* and the second electrode portion 110*c* may respectively be the same as the vibration portion 110*a* and the second electrode portion 110*c* described above with reference to FIG. 3A, and thus, like reference numerals refer to like elements and their repetitive descriptions may be omitted.

Figure 8:
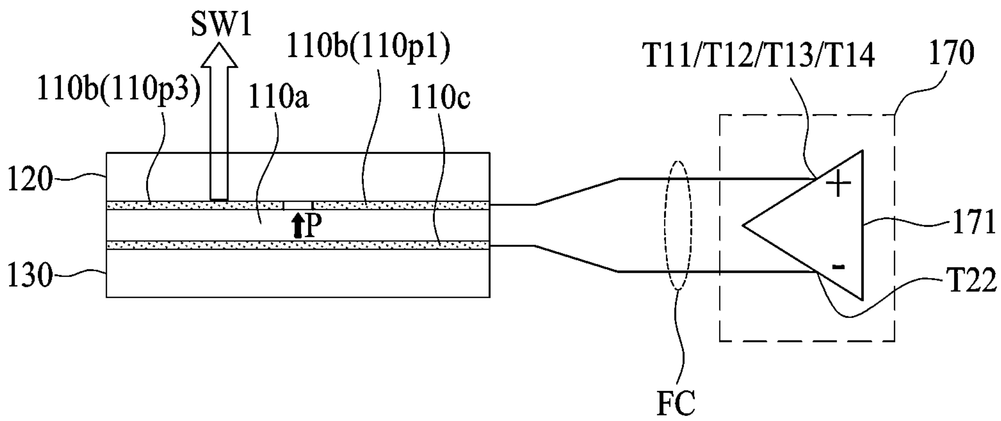
FIG. 8 illustrates a vibration driving circuit of a vibration apparatus according to another embodiment of the present disclosure.

FIG. 8 illustrates a vibration driving circuit of a vibration apparatus according to another embodiment of the present disclosure.

With reference to FIG. 8, the vibration apparatus according to another embodiment of the present disclosure may further include a vibration driving circuit 170.

The vibration driving circuit 170 may be electrically connected to a vibration portion 110*a* through a flexible cable FC. The vibration driving circuit 170 according to an embodiment of the present disclosure may generate a first vibration driving signal for generating a first sound wave SW1 based on a vibration of a vibration device and may supply the generated first vibration driving signal to the vibration device. For example, the first sound wave SW1 may be a sound wave in the ultrasonic band or a haptic feedback signal.

The vibration driving circuit 170 according to an embodiment of the present disclosure may include a first amplifier 171 connected to the vibration device.

The first amplifier (or a first signal generating circuit) 171 may generate a first vibration driving signal in an AC type having a first polarity signal and a second polarity signal based on a sound source. The first amplifier 171 according to an embodiment of the present disclosure may include a first output terminal, which outputs the first polarity signal of the first vibration driving signal, and a second output terminal T22 which outputs the second polarity signal of the first vibration driving signal. For example, the first output terminal may include a 1-1$^{st}$ output terminal T11, a 1-2$^{nd}$ output terminal T12, a 1-3$^{rd}$ output terminal T13, and a 1-4$^{th}$ output terminal T14.

The vibration portions 110*a* configured in the vibration device may have a polarization direction P from a second electrode portion 110*c* to a first electrode portion 110*b*.

A first polarity signal of a first vibration driving signal output from a 1-1$^{st}$ output terminal T11 of the first amplifier 171 may be supplied to the first pad portion 110*p*1 configured in a vibration device through the flexible cable FC, and then may be supplied to the plurality of first electrode portion 110*b* electrically connected to the first pad portion 110*p*1. A first polarity signal of a first vibration driving signal output from a 1-2$^{nd}$ output terminal T12 of the first amplifier 171 may be supplied to the second pad portion 110*p*2 configured in a vibration device through the flexible cable FC, and then may be supplied to the plurality of first electrode portion 110*b* electrically connected to the second pad portion 110*p*2. A first polarity signal of the first vibration driving signal output from a 1-3$^{rd}$ output terminal T13 may be supplied to the third pad portion 110*p*3 configured in the vibration device through the flexible cable FC, and then may be supplied to the plurality of first electrode portion 110*b* electrically connected to the third pad portion 110*p*3. A first polarity signal of a first vibration driving signal output from a 1-4$^{th}$ output terminal T14 of the first amplifier 171 may be supplied to the fourth pad portion 110*p*4 configured in a vibration device through the flexible cable FC, and then may be supplied to the plurality of first electrode portion 110*b* electrically connected to the fourth pad portion 110*p*4. A second polarity signal of the first vibration driving signal output from a second output terminal T22 of the first amplifier 171 may be supplied to the second electrode portion 110*c* configured in the vibration device through the flexible cable FC. In FIG. 8, for convenience of description, the 1-3$^{th}$ output terminal T13 is illustrated in a region adjacent to the first pad portion 110*p*1, but in a plan view, may be configured to be connected to the third pad portion 110*p*3.

The vibration portions 110*a* configured in the vibration device illustrated in FIG. 8 may have a polarization direction P from the second electrode portion 110*c* to the first electrode portion 110*b*. The first polarity signal of the first vibration driving signal may be supplied to the plurality of first electrode portion 110*b* of the vibration device, and the second polarity signal of the first vibration driving signal may be supplied to the second electrode portion 110*c* of the vibration device.

Figure 9A:
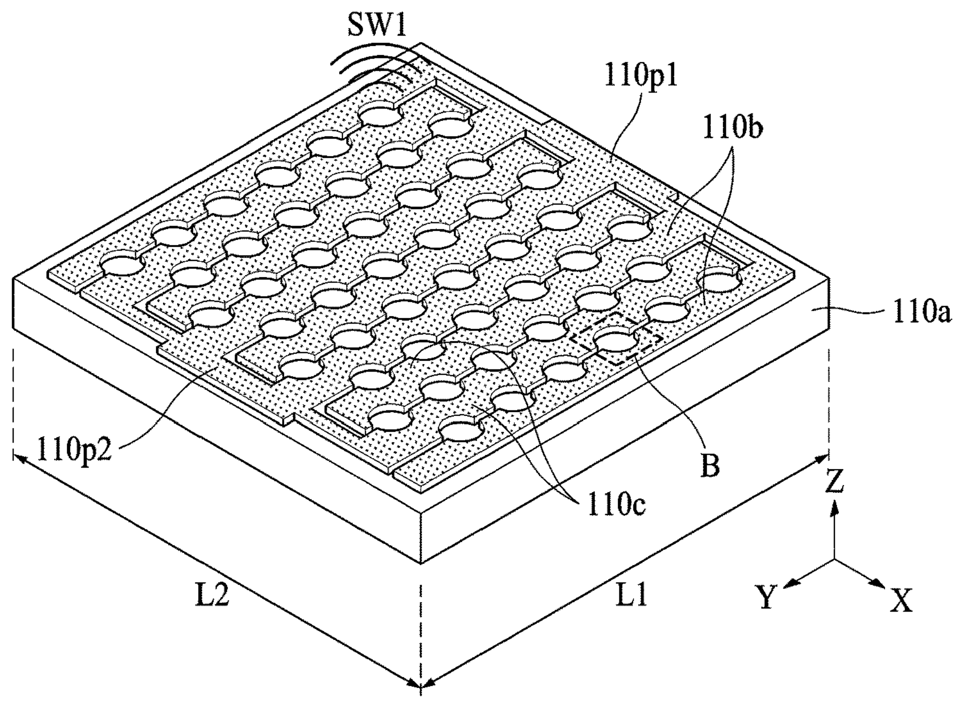
FIG. 9A is a perspective view of a vibration apparatus according to another embodiment of the present disclosure.
Figure 9B:
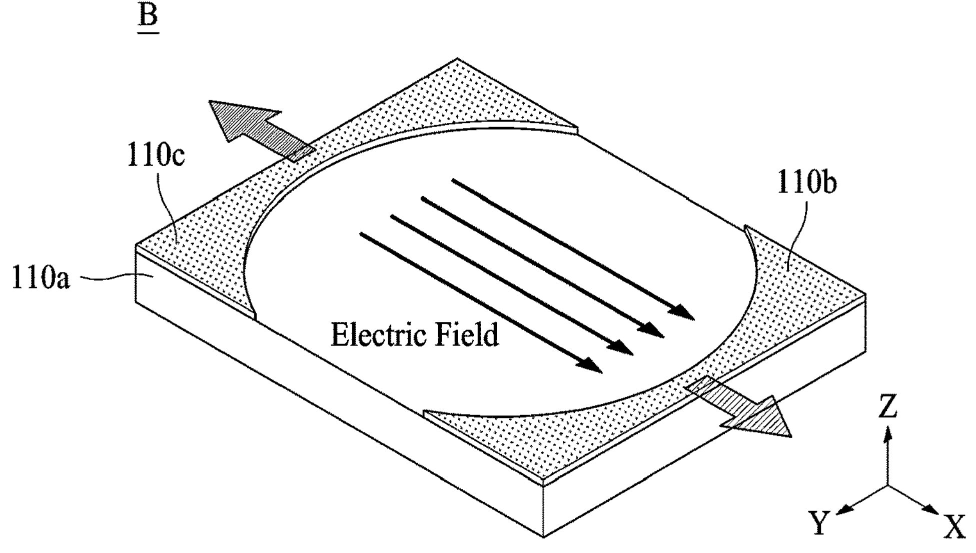
FIG. 9B illustrates a region B of FIG. 9A.
Figure 10:
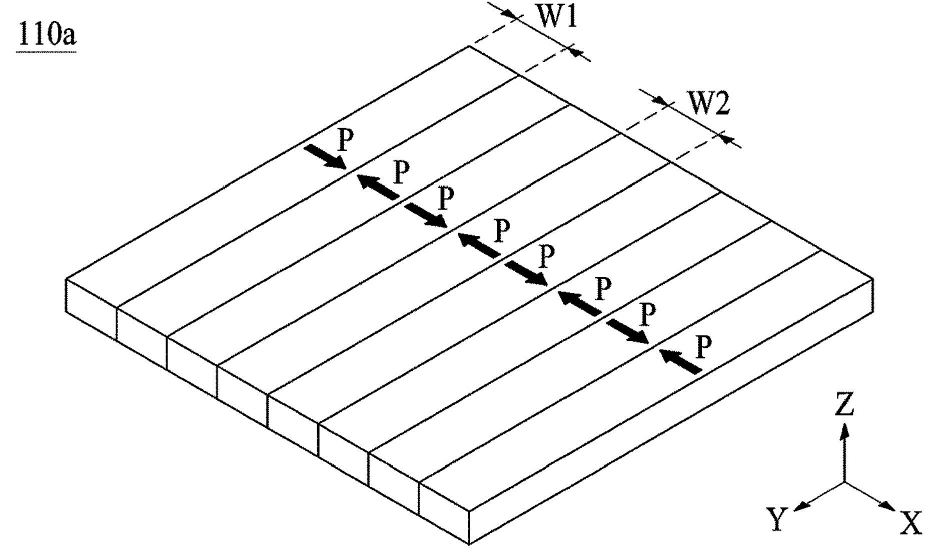
FIG. 10 is a perspective view of a vibration portion of FIG. 9A.
Figure 11:
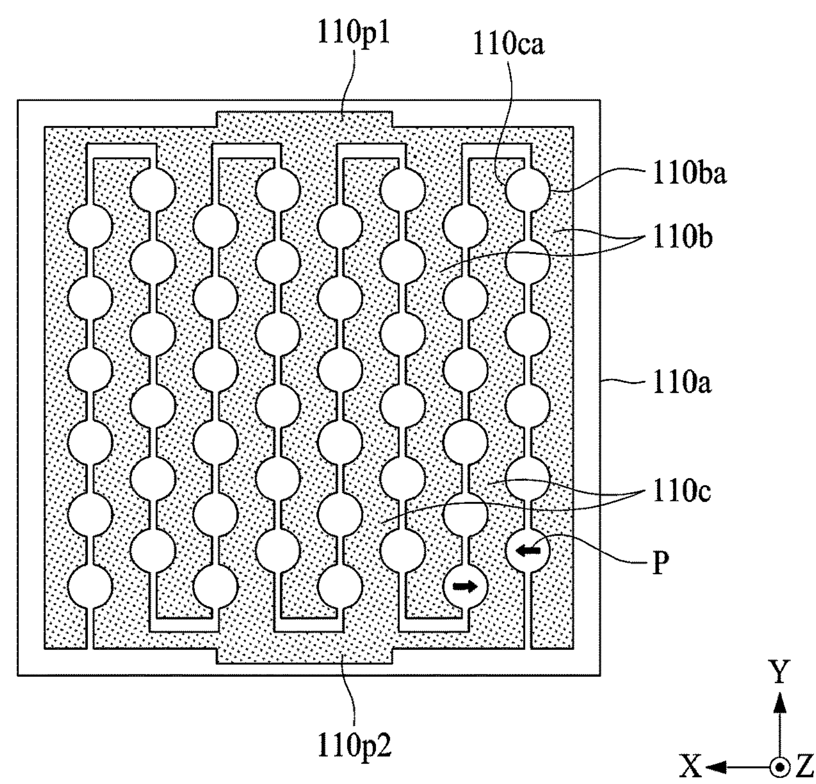
FIG. 11 is a plan view of the vibration apparatus according to another embodiment of the present disclosure.

FIG. 9A is a perspective view of a vibration apparatus according to another embodiment of the present disclosure. FIG. 9B illustrates a region B of FIG. 9A. FIG. 10 is a perspective view of a vibration portion of FIG. 9A. FIG. 11 is a plan view of the vibration apparatus according to another embodiment of the present disclosure.

With reference to FIGS. 9A to 11, all of a first electrode portion 110*b* and a second electrode portion 110*c* may be disposed on a first surface or an upper portion of a vibration portion 110*a*, and thus, the vibration apparatus according to another embodiment of the present disclosure may be referred to as an in-plane vibration apparatus.

According to another embodiment of the present disclosure, the first electrode portion 110*b* may include at least a pair or more of finger type electrodes parallel to each other over the first surface of the vibration portion 110*a*, and the second electrode portion 110*c* may include at least a pair or more of finger type electrodes parallel to each other over the first surface of the vibration portion 110*a*. The finger type first electrode portion 110*b* may be connected to a first pad portion 110*p*1 which is disposed at one edge of the first surface of the vibration portion 110*a*, and the finger type second electrode portion 110*c* may be connected to a second pad portion 110*p*2 which is disposed at the other edge of the first surface of the vibration portion 110*a*. A plurality of first electrode portions 110*b* having a finger type may be configured to engage with a plurality of second electrode portions 110*c* having a finger type. For example, the plurality of first electrode portions 110*b* and the plurality of second electrode portions 110*c* having a finger type may be spaced apart from one another by a predetermined distance in parallel and may engage with one another not to contact.

With reference to FIG. 9B, when a positive (+) signal is applied to the first electrode portion 110*b* and a negative (−) signal is applied to the second electrode portion 110*c*, an electric field may be generated between the first electrode portion 110*b* and the second electrode portion 110*c*. As in FIG. 9B, when an electric field E is generated, the vibration portion 110*a* including a piezoelectric material may be deformed by a piezoelectric effect, and a deformation rate (ΔL) may be calculated by multiplying a piezoelectric deformation coefficient and the electric field.

With reference to FIG. 10, in the vibration portion 110*a* of the vibration apparatus according to another embodiment of the present disclosure, a vibration portion 110*a* having a polarization direction P parallel to a first direction X and a vibration portion 110*a* having a different polarization direction P may be alternately and repeatedly arranged along the first direction X. A first width W1 of the vibration portion 110*a* having the polarization direction P parallel to the first direction X and a second width W2 of the vibration portion 110*a* having the different polarization direction P may be the same, or may have different sizes. Addition, as described below in FIG. 11, the first width W1 and the second width W2 may be set so that the vibration portion 110*a* having the polarization direction P parallel to the first direction X and the vibration portion 110*a* having the different polarization direction P are alternately arranged along the first direction X at a plurality of circular patterns defined by a first engraved pattern 110*ba* and a second engraved pattern 110*ca*.

With reference to FIGS. 9B and 10, a direction of an electric field of FIG. 9B may be parallel to the first direction X and the polarization direction P of FIG. 10 may be parallel to the first direction X, and thus, with respect to the first direction X, a piezoelectric deformation coefficient (or a piezoelectric constant) in the first direction may be defined as $d_{33}$. Accordingly, a deformation rate (ΔL) of the vibration portion of the vibration apparatus according to another embodiment of the present disclosure may be calculated as $E \times d_{33}$.

With reference to FIG. 11 in conjunction with FIG. 9A, based on a first electrode portion 110*b* and a second electrode portion 110*c* engaging and intersecting with each other, a vibration portion 110*a* having a polarization direction P parallel to a first direction X, and a vibration portion 110*a* having a different polarization direction P, a vibration device according to another embodiment of the present disclosure may be implemented to be recognized like that an array such as a circular pattern electrode is arranged. Addition, with reference to FIG. 11, the first electrode portion 110*b* may include a first engraved pattern 110*ba*, the second electrode portion 110*c* may include a second engraved pattern 110*ca*, and the first electrode portion 110*b* and the second electrode portion 110*c* may configure a plurality of circular patterns. The plurality of circular patterns may be arranged as an array type and may be implemented to be recognized as a plurality of vibration devices or vibration generators, which have one resonance point by limiting (or defining) an active region or a vibration region of the vibration portion 110*a* as a circular pattern region.

Moreover, the plurality of circular patterns configured with the first engraved pattern 110*ba* and the second engraved pattern 110*ca* may have a certain radius as in FIG. 3B described above and may be arranged as an array type at the first surface or an upper portion of the vibration portion 110*a*. The vibration device 110 may include one vibration portion 110*a* and first and second electrode portions 110*b* and 110*c* disposed at the first surface or the upper portion of the vibration portion 110*a*, and thus, the vibration device 110 may be configured as one vibration apparatus physically. However, the first engraved pattern 110*ba* and the second engraved pattern 110*ca* disposed at the first surface or the upper portion of the vibration portion 110*a* arranged as an array type with a plurality of circular patterns may be implemented to be recognized as a plurality of vibration devices or vibration generators, which have one resonance point by limiting (or defining) an active region or a vibration region of the vibration portion 110*a* as a circular pattern region based on the first electrode portion 110*b* and the second electrode portion 110*c*.

According to an embodiment of the present disclosure, the vibration device 110 including the first electrode portion 110*b* having an array type of a plurality of circular patterns configured with the first engraved pattern 110*ba* and the second engraved pattern 110*ca* may be implemented so that a length of a circular pattern defined by the first engraved pattern 110*ba* and the second engraved pattern 110*ca* is recognized as a length of the vibration device in Equation 1. Therefore, like that a resonance frequency is inversely proportional to a length of the vibration device in Equation 1, a resonance frequency of the vibration apparatus according to an embodiment of the present disclosure may be inversely proportional to a radius of a circular pattern of the first engraved pattern 110*ba* and the second engraved pattern 110*ca*. Addition, as expressed in Equation 1, a resonance frequency of the vibration apparatus may be inversely proportional to a first length L1 of the vibration device 110 along a first direction X or a second length L2 along a second direction Y.

According to an embodiment of the present disclosure, in the in-plane vibration apparatus, a displacement direction may match a direction of the piezoelectric deformation coefficient $d_{33}$, and thus, a displacement of the vibration apparatus may increase and an ultrasound resonance design of 20 kHz to 10 MHz band may be implemented.

Figure 12:
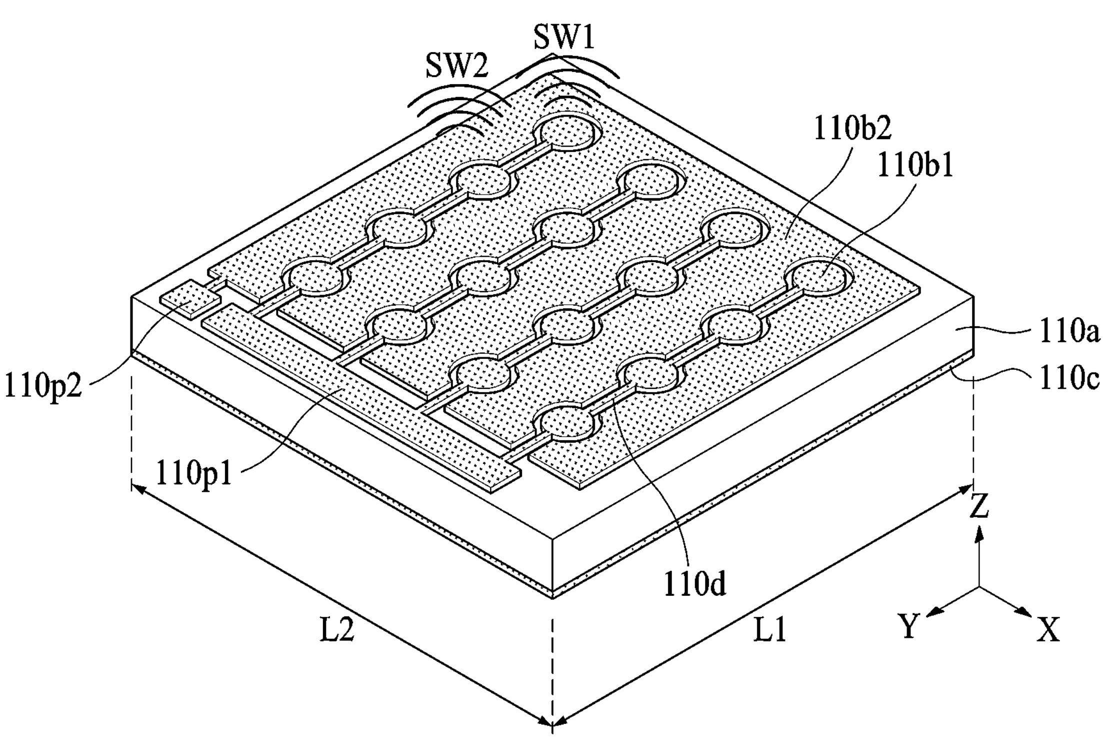
FIG. 12 is a perspective view of a vibration apparatus according to another embodiment of the present disclosure.
Figure 13:
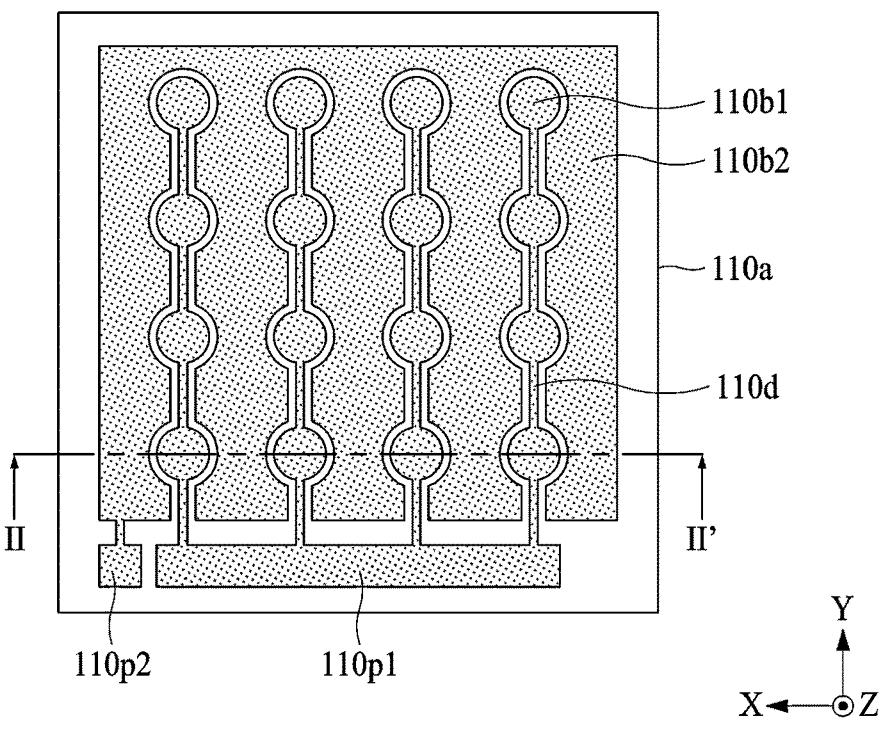
FIG. 13 is a plan view of a vibration apparatus according to another embodiment of the present disclosure.
Figure 14A:
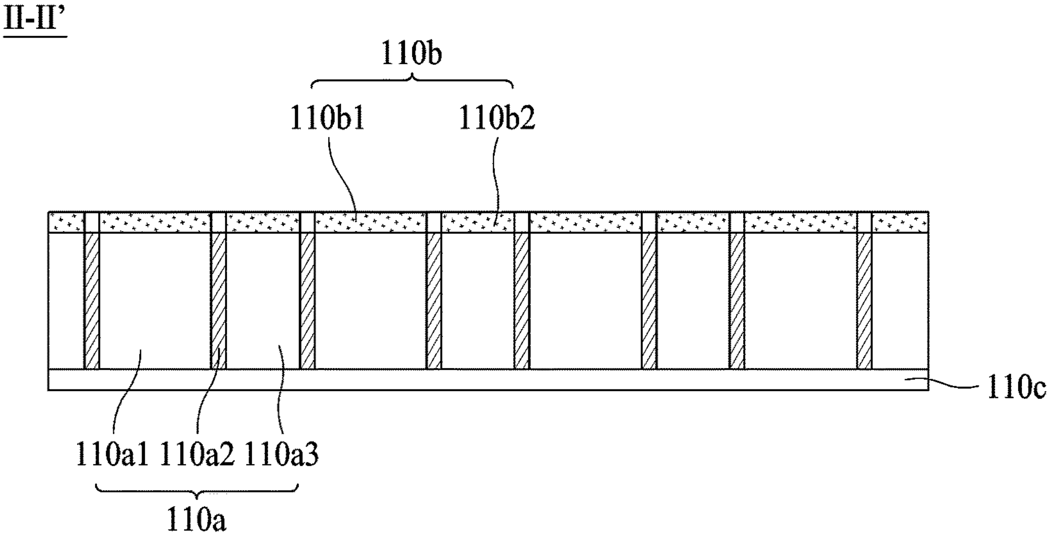
FIG. 14A is a perspective view of a vibration portion of FIG. 13.
Figure 14B:
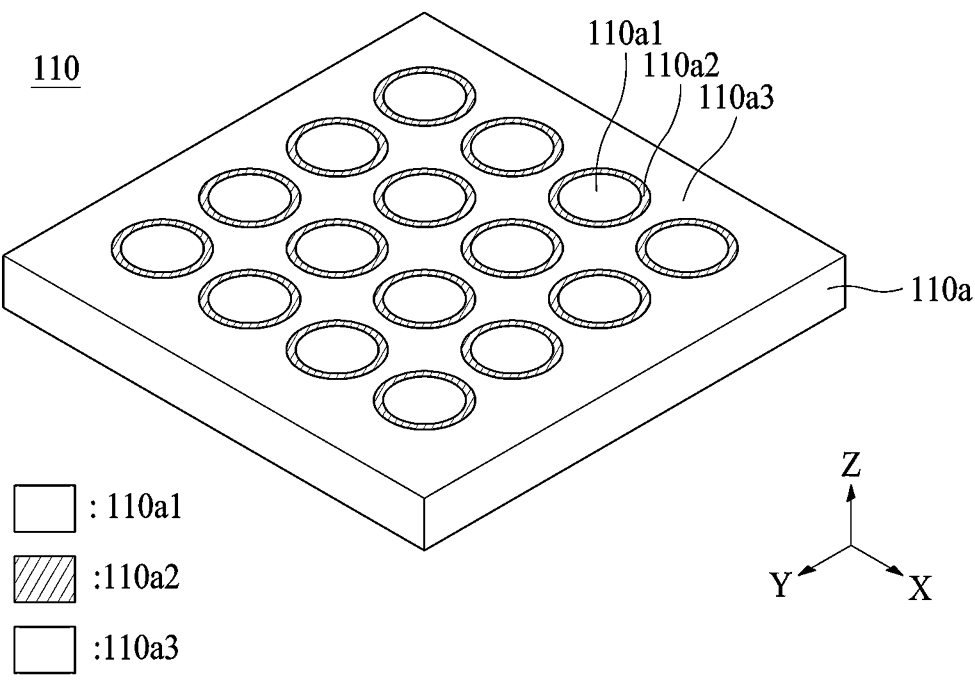
FIG. 14B is a cross-sectional view taken along line II-II' of FIG. 13.

FIG. 12 is a perspective view of a vibration apparatus according to another embodiment of the present disclosure. FIG. 13 is a plan view of a vibration apparatus according to another embodiment of the present disclosure. FIG. 14A is a perspective view of a vibration portion of FIG. 13. FIG. 14B is a cross-sectional view taken along line II-II' of FIG. 13.

With reference to FIGS. 12, 13, 14A, and 14B, a vibration device of a vibration apparatus according to an embodiment of the present disclosure may include a vibration portion 110*a*, an ultrasound electrode portion 110*b*1 and a sound electrode portion 110*b*2 disposed at a first surface or an upper surface of the vibration portion 110*a*, an ultrasound pad portion 110*p*1 of the ultrasound electrode portion 110*b*1, a sound pad portion 110*p*2 of the sound electrode portion 110*b*2, and a line portion 110*d* connecting the ultrasound electrode portion 110*b*1 and the ultrasound pad portion 110*p*1 and connecting the sound electrode portion 110*b*2 and the sound pad portion 110*p*2, and may include a third electrode portion 110*c* disposed at a second surface which is opposite to or different from the first surface of the vibration portion 110*a*. The ultrasound electrode portion 110*b*1 may be a first electrode portion, but embodiments of the present disclosure are not limited thereto. The sound electrode portion 110*b*2 may be a second electrode portion, but embodiments of the present disclosure are not limited thereto. The ultrasound pad portion 110*p*1 may be a pad portion or a first pad portion, but embodiments of the present disclosure are not limited thereto.

According to another embodiment of the present disclosure, the ultrasound electrode portion 110*b*1 may include at least a pair or more of finger type electrodes parallel to each other over the first surface of the vibration portion 110*a*. The first electrode portion 110*b* having a finger type may be connected to a first pad portion 110*p*1 which is disposed at one edge of the first surface of the vibration portion 110*a*. The sound electrode portion 110*b*2 may be formed over the first surface of the vibration portion 110*a* to surround a plurality of finger type electrodes.

The vibration apparatus according to another embodiment of the present disclosure may generate a first sound wave SW1 at the ultrasound electrode portion 110*b*1 and may generate a second sound wave SW2 at the sound electrode portion 110*b*2. For example, the first sound wave SW1 may include a frequency of 200 Hz to 100 kHz band or a frequency of 20 kHz to 10 MHz band, and the second sound wave SW2 may include an audible frequency of a frequency of 200 Hz to 20 kHz band. However, a frequency band of the first sound wave SW1 and a frequency band of the second sound wave SW2 are not limited thereto.

The first electrode portion 110*b* of the vibration apparatus according to another embodiment of the present disclosure may be disposed at an upper portion or the first surface of the vibration portion 110*a*. The first electrode portion 110*b* according to an embodiment of the present disclosure may be provided in plurality at an upper portion or the first surface of the vibration portion 110*a*. Each of the plurality of first electrode portions 110*b* may be a circular pattern electrode and may be arranged as an array type. Addition, in the vibration apparatus according to an embodiment of the present disclosure, each of the plurality of plurality of first electrode portions 110*b* disposed at the upper portion or the first surface of the vibration portion 110*a* may be a circular pattern electrode and may be arranged as an array type, and the vibration device 110 may include one vibration portion 110*a* which includes the first vibration portion 110*al*, the third vibration portion 110*a*3, and the second vibration portion 110*a*2 between the first vibration portion 110*a*1 and the third vibration portion 110*a*3, the plurality of first electrode portion 110*b* disposed at the upper portion or the first surface of the vibration portion 110*a*, and the line portion 110*d* connected between the plurality of first electrode portions 110*b*. Therefore, the vibration device 110 may be configured as one vibration apparatus physically, but each of the plurality of first electrode portion 110*b* which is a circular pattern electrode and is arranged as an array type may be implemented to be recognized as a plurality of vibration devices or vibration generators, which have one resonance point by limiting (or defining) an active region or a vibration region of the vibration portion 110*a* as a circular pattern region of each of the plurality of first electrode portion 110*b*.

According to an embodiment of the present disclosure, the vibration device 110 including the plurality of first electrode portion 110*b* disposed in an array type having a circular electrode pattern may be implemented so that a length of one first electrode portion 110*b* generating a resonance frequency is recognized as a length of the vibration device in Equation 1. Therefore, like that a resonance frequency is inversely proportional to a length of the vibration device in Equation 1, a resonance frequency of the vibration apparatus according to an embodiment of the present disclosure may be inversely proportional to a radius of the first electrode portion 110*b*. Addition, as expressed in Equation 1, a resonance frequency of the vibration apparatus may be inversely proportional to a first length L1 of the vibration device 110 along a first direction X or a second length L2 along a second direction Y. Based on the arrangement of the plurality of first electrode portion 110*b* including a circular pattern, the vibration apparatus according to an embodiment of the present disclosure may realize an effect which is similar to or the same as the arrangement of a plurality of piezoelectric ceramics or piezoelectric devices.

Moreover, the vibration apparatus according to an embodiment of the present disclosure may output a sound wave in a forward direction of an apparatus by the plurality of first electrode portion 110*b*, may be applied as a large-area ultrasound generator or a large-area ultrasound haptic display based on a beamforming effect by constructive interference caused by an array structure of the plurality of first electrode portions 110*b* arranged in row and column, and may be applied as a large-area display apparatus, an ultrasound generator, a sensor, or the like.

With reference to FIG. 14B, a vibration portion 110*a* of a vibration device according to an embodiment of the present disclosure may include a first vibration portion 110*al*, a second vibration portion 110*a*2, and a third vibration portion 110*a*3.

The first vibration portion 110*a*1 and the third vibration portion 110*a*3 according to an embodiment of the present disclosure may be configured as an inorganic material portion. The inorganic material portion may include a piezoelectric material, a composite piezoelectric material, or an electroactive material which has a piezoelectric effect. For example, the first vibration portion 110*a*1 and the third vibration portion 110*a*3 may include a piezoelectric material which is be substantially the same as the vibration portion 110*a* described above with reference to FIG. 2.

The second vibration portion 110*a*2 according to an embodiment of the present disclosure may be configured as an organic material portion. For example, the organic material portion may be disposed between the first vibration portion 110*a*1 and the third vibration portion 110*a*3, and thus, the second vibration portion 110*a*2 may absorb an impact applied to the first vibration portion 110*a*1 and the third vibration portion 110*a*3, may release a stress concentrating on the first vibration portion 110*a*1 and the third vibration portion 110*a*3, may enhance the durability of the first vibration portion 110*a*1 and the third vibration portion 110*a*3 or the vibration device 110, and may provide flexibility to the first vibration portion 110*a*1 and the third vibration portion 110*a*3 or the vibration device 110.

The organic material portion configured in the second vibration portion 110*a*2 may be an organic material or an organic polymer that has a flexible characteristic in comparison with the first vibration portion 110*a*1 and the third vibration portion 110*a*3, but embodiments of the present disclosure are not limited thereto. For example, the second vibration portion 110*a*2 may be referred to as an adhesive portion, a stretch portion, a bending portion, a damping portion, or a flexible portion, or the like which has flexibility, but embodiments of the present disclosure are not limited thereto.

The second vibration portion 110*a*2 may be configured in plurality. For example, the second vibration portion 110*a*2 may be configured in plurality to surround each of the plurality of first vibration portion 110*al*. Each of the plurality of second vibration portion 110*a*2 may be disposed between the first vibration portion 110*a*1 and the third vibration portion 110*a*3. Therefore, in the vibration portion 110*a* or the vibration device 110, vibration energy by a link in a unit lattice of the first vibration portion 110*a*1 may increase by a corresponding second vibration portion 110*a*2. Thus, a vibration characteristic may increase, and a piezoelectric characteristic and flexibility may be secured. For example, the second vibration portion 110*a*2 may include one or more among an epoxy-based polymer, an acrylic-based polymer, and a silicone-based polymer, but embodiments of the present disclosure are not limited thereto.

As illustrated in FIGS. 14A and 14B, in the vibration device 110 according to another embodiment of the present disclosure, the first vibration portion 110*a*1 configured as an inorganic material portion may be disposed at an inner portion thereof in a shape such as a circular pillar shape, the second vibration portion 110*a*2 configured as an organic material portion may be disposed in a shape surrounding the first vibration portion 110*a*1, and the third vibration portion 110*a*3 configured as an inorganic material portion may be disposed at the other space (or the remaining space). Subsequently, the ultrasound electrode portion 110*b*1 may be disposed at a first surface of the first vibration portion 110*a*1 to correspond to the first vibration portion 110*a*1, and the sound electrode portion 110*b*2 may be disposed at a first surface of the third vibration portion 110*a*3 to correspond to the third vibration portion 110*a*3. Subsequently, the second electrode portion 110*c* may be disposed at a second surface which is opposite to or different from the first surface of the vibration portion 110*a*.

Figure 15:
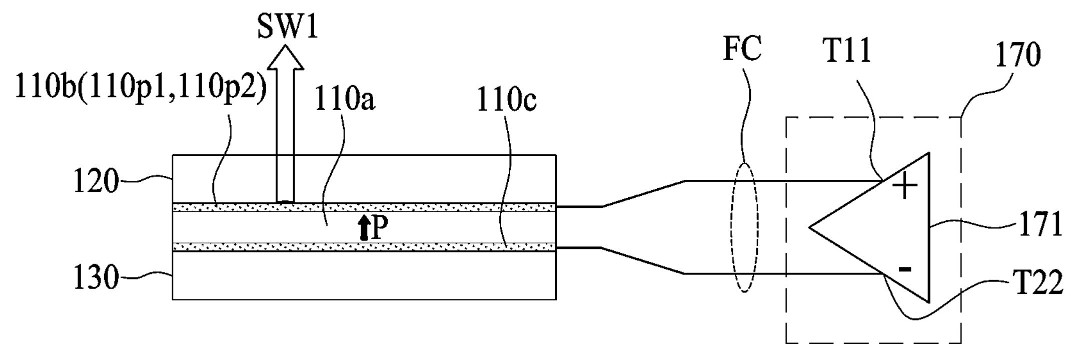
FIG. 15 illustrates a vibration driving circuit of a vibration apparatus according to another embodiment of the present disclosure.

FIG. 15 illustrates a vibration driving circuit of a vibration apparatus according to another embodiment of the present disclosure.

With reference to FIG. 15, the vibration apparatus according to an embodiment of the present disclosure may further include a vibration driving circuit 170.

The vibration driving circuit 170 may be electrically connected to a vibration portion 110*a* through a flexible cable FC. The vibration driving circuit 170 according to an embodiment of the present disclosure may generate a first vibration driving signal for generating a first sound wave SW1 based on a vibration of a vibration device and may supply the generated first vibration driving signal to the vibration device.

The vibration driving circuit 170 according to an embodiment of the present disclosure may include a first amplifier 171 connected to the vibration device.

The first amplifier (or a first signal generating circuit) 171 may generate a first vibration driving signal in an AC type having a first polarity signal and a second polarity signal based on a sound source. The first amplifier 171 according to an embodiment of the present disclosure may include a first output terminal T11, which outputs the first polarity signal of the first vibration driving signal, and a second output terminal T22 which outputs the second polarity signal of the first vibration driving signal.

The vibration portions 110*a* configured in the vibration device may have a polarization direction P from a second electrode portion 110*c* to a first electrode portion 110*b*.

The first polarity signal of the first vibration driving signal output from the first output terminal T11 of the first amplifier 171 may be supplied to a pad portion 110*p*1 and 110*p*2 of configured in the vibration device through the flexible cable FC, and then may be supplied to the plurality of first electrode portion 110*b* electrically connected to the pad portion 110*p*1 and 110*p*2. The second polarity signal of the first vibration driving signal output from the second output terminal T22 of the first amplifier 171 may be supplied to the second electrode portion 110*c* configured in the vibration device through the flexible cable FC.

The vibration portions 110*a* configured in the vibration device illustrated in FIG. 15 may have a polarization direction P from the second electrode portion 110*c* to the first electrode portion 110*b*. The first polarity signal of the first vibration driving signal may be supplied to the first electrode portion 110*b* of the vibration device, and the second polarity signal of the first vibration driving signal may be supplied to the second electrode portion 110*c* of the vibration device.

Figure 16:
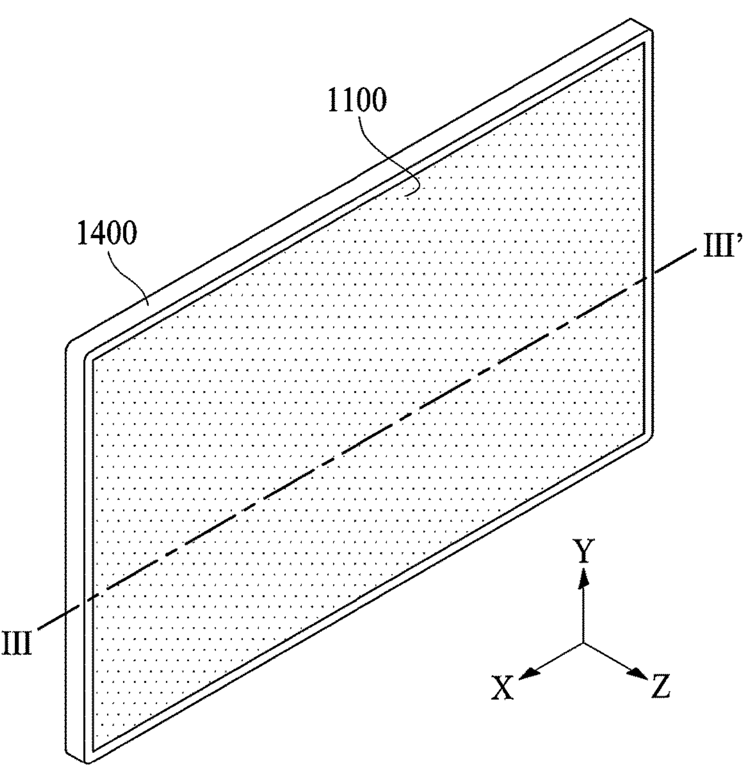
FIG. 16 illustrates an apparatus according to an embodiment of the present disclosure.
Figure 17:
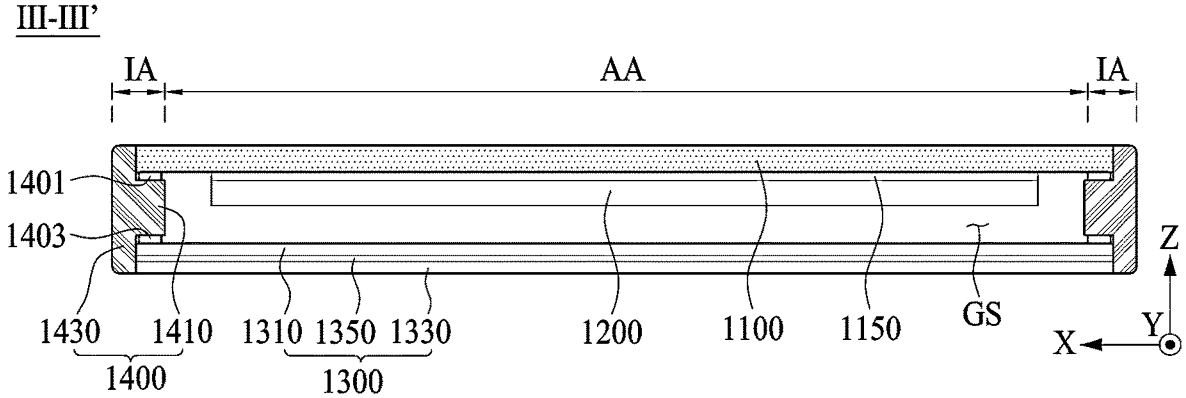
FIG. 17 is a cross-sectional view taken along line III-III' of FIG. 16.

FIG. 16 illustrates an apparatus according to an embodiment of the present disclosure. FIG. 17 is a cross-sectional view taken along line illustrated in FIG. 16.

With reference to FIGS. 16 and 17, an apparatus (or a display apparatus) according to an embodiment of the present disclosure may include a display panel (a vibration object or a vibration member) 1100 configured to display an image, and a vibration generating apparatus 1200 to vibrate the display panel 1100 at a rear surface (or a backside surface) of the display panel 1100.

The display panel 1100 may display an image, for example, an electronic image, a digital image, a still image, or a video image. For example, the display panel 1100 may display an image by outputting light. The display panel 1100 may be a curved display panel, or may be any type of display panel, such as a liquid crystal display panel, an organic light-emitting display panel, a quantum dot light-emitting display panel, a micro light-emitting diode display panel, and an electrophoresis display panel, or the like. The display panel 1100 may be a flexible display panel. For example, the display panel 1100 may a flexible light emitting display panel, a flexible electrophoretic display panel, a flexible electro-wetting display panel, a flexible micro light emitting diode display panel, or a flexible quantum dot light emitting display panel, but embodiments of the present disclosure are not limited thereto.

According to an embodiment of the present disclosure, the vibration object may include one or more of a display panel including a plurality of pixels configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, wood, plastic, glass, metal, cloth, a fiber, paper, rubber, leather, carbon, and a mirror.

The display panel 1100 according to an embodiment of the present disclosure may include a display area AA (or an active area) for displaying an image according to driving of the plurality of pixels. Also, the display panel 1100 may further include a non-display area IA surrounding the display area AA, but embodiments of the present disclosure are not limited thereto.

The display panel 1100 according to an embodiment of the present disclosure may include a pixel array portion disposed at the display area AA of the substrate. The pixel array portion may include a plurality of pixels which display an image based on a signal supplied through the signal lines. The signal lines may include a gate line, a data line and a pixel driving power line, or the like, but embodiments of the present disclosure are not limited thereto.

Each of the plurality of pixels may include a pixel circuit layer including a driving thin film transistor (TFT) provided at the pixel area which is configured by a plurality of gate lines and/or a plurality of data lines, a first electrode (or a pixel electrode) electrically connected to the driving TFT, a light emitting device formed at the anode electrode, and a second electrode (or a common electrode) electrically connected to the light emitting device.

The light emitting device according to an embodiment of the present disclosure may include an organic light emitting device layer formed at the first electrode. The organic light emitting device layer may be implemented to emit light having the same color (for example, white light) for each pixel, or may be implemented to emit light having a different color (for example, red light, green light, or blue light) for each pixel.

The light emitting device according to another embodiment of the present disclosure may include may include a micro light emitting diode device electrically connected to each of the first electrode and the second electrode. The micro light emitting diode device may be a light emitting diode implemented as an integrated circuit (IC) or chip type. The micro light emitting diode device may include a first terminal electrically connected to the first electrode and a second terminal electrically connected to the second electrode.

The display panel 1100 according to another embodiment of the present disclosure may include a first substrate, a second substrate, and a liquid crystal layer. The first substrate may be an upper substrate or a thin film transistor (TFT) array substrate. For example, the first substrate may include a pixel array portion including a plurality of pixels which are respectively provided in a plurality of pixel areas defined by intersections of a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage. The second substrate may be a lower substrate or a color filter array substrate. For example, the second substrate may include a pixel defining pattern including an opening area overlapping with the pixel area formed at the first substrate, and a color filter layer formed at the opening area. The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

The vibration generating apparatus 1200 may vibrate the display panel 1100 at the rear surface of the display panel 1100, thereby providing a sound and/or a haptic feedback based on the vibration of the display panel 1100 to a user. The vibration generating apparatus 1200 may be implemented at the rear surface of the display panel 1100 to directly vibrate the display panel 1100.

As an embodiment of the present disclosure, the vibration generating apparatus 1200 may vibrate according to a vibration driving signal synchronized with an image displayed by the display panel 1100 to vibrate the display panel 1100. As another embodiment of the present disclosure, the vibration generating apparatus 1200 may vibrate according to a haptic feedback signal (or a tactile feedback signal) synchronized with a user touch applied to a touch panel (or a touch sensor layer) which is disposed at the display panel 1100 or embedded into the display panel 1100 and may vibrate the display panel 1100. Accordingly, the display panel 1100 may vibrate based on a vibration of the vibration generating apparatus 1200 to provide a user (or a viewer) with at least one or more of a sound and a haptic feedback.

The vibration generating apparatus 1200 according to an embodiment of the present disclosure may be implemented to have a size corresponding to the display area AA of the display panel 1100. A size of the vibration generating apparatus 1200 may be 0.9 to 1.1 times a size of the display area AA, but embodiments of the present disclosure are not limited thereto. For example, a size of the vibration generating apparatus 1200 may be the same as or smaller than the size of the display area AA. For example, a size of the vibration generating apparatus 1200 may be the same as or approximately same as the display area AA of the display panel 1100, and thus, the vibration generating apparatus 1200 may cover a most region of the display panel 1100 and a vibration generated by the vibration generating apparatus 1200 may vibrate a whole portion of the display panel 1100, and thus, localization of a sound may be high, and satisfaction of a user may be improved. Addition, a contact area (or panel coverage) between the display panel 1100 and the vibration generating apparatus 1200 may increase, and thus, a vibration region of the display panel 1100 may increase, thereby improving a sound of a middle-low-pitched sound band generated based on a vibration of the display panel 1100. Addition, a vibration generating apparatus 1200 applied to a large-sized display apparatus may vibrate a whole display panel 1100 having a large size (or a large area), and thus, localization of a sound based on a vibration of the display panel 1100 may be further enhanced, thereby realizing an improved sound effect.

The vibration generating apparatus 1200 according to an embodiment of the present disclosure may include one or more of the vibration apparatus described above with reference to FIGS. 1 to 15, and thus, the repetitive description thereof may be omitted.

The apparatus according to an embodiment of the present disclosure may further include a connection member 1150 disposed between the display panel 1100 and the vibration generating apparatus 1200.

The connection member 1150 may be disposed between the display panel 1100 and the vibration generating apparatus 1200, and thus, may connect or couple the vibration generating apparatus 1200 to the rear surface of the display panel 1100. For example, the vibration generating apparatus 1200 may be directly connected or coupled to the rear surface of the display panel 1100 by the connection member 1150, and thus, may be supported by or disposed at the rear surface of the display panel 1100.

The connection member 1150 according to an embodiment of the present disclosure may be configured as a material including an adhesive layer which is good in adhesive force or attaching force with respect to each of the rear surface of the display panel 1100 and the vibration generating apparatus 200. For example, the connection member 1150 may include a foam pad, a double-sided tape, or an adhesive, or the like, but embodiments of the present disclosure are not limited thereto. For example, the adhesive layer of the connection member 1150 may include epoxy, acrylic, silicone, or urethane, but embodiments of the present disclosure are not limited thereto. For example, the adhesive layer of the connection member 1150 may include an acrylic-based material which is relatively better in adhesive force and hardness of acrylic and urethane. Accordingly, a vibration of the vibration generating apparatus 1200 may be transferred to the display panel 1100 well.

The connection member 1150 according to another embodiment of the present disclosure may further include a hollow portion between the display panel 1100 and the vibration generating apparatus 1200. The hollow portion of the connection member 1150 may provide an air gap between the display panel 1100 and the vibration generating apparatus 1200. Due to the air gap, a sound wave (or a sound pressure) based on a vibration of the vibration generating apparatus 1200 may not be dispersed by the connection member 1150, and may concentrate on the display panel 1100. Thus, the loss of a vibration caused by the connection member 1150 may be minimized, thereby increasing a sound pressure characteristic of a sound generated based on a vibration of the display panel 1100.

The apparatus according to an embodiment of the present disclosure may further include a supporting member 1300 disposed at a rear surface of the display panel 1100.

The supporting member 1300 may be may cover a rear surface of the display panel 1100. For example, the supporting member 1300 may cover a whole rear surface of the display panel 1100 with a gap space GS therebetween. For example, the supporting member 1300 may include at least one or more of a glass material, a metal material, and a plastic material, but embodiments of the present disclosure are not limited thereto. For example, the supporting member 1300 may be referred to as a rear surface structure, a set structure, a cover bottom, or a back cover, but embodiments of the present disclosure are not limited thereto.

The supporting member 1300 according to an embodiment of the present disclosure may include a first supporting member 1310 and a second supporting member 1330.

The first supporting member 1310 may cover a rear surface of the display panel 1100. For example, the first supporting member 1310 may be a member which covers a whole rear surface of the display panel 1100. For example, the first supporting member 1310 may include at least one or more materials of a glass material, a metal material, and a plastic material, but embodiments of the present disclosure are not limited thereto. For example, the first supporting member 1310 may be an inner plate, but embodiments of the present disclosure are not limited thereto.

The first supporting member 1310 may be spaced apart from a rearmost surface of the display panel 1100 or the vibration generating apparatus 1200 with a gap space GS therebetween. For example, the gap space GS may be referred to as an air gap, a vibration space, a sound resonance box, or the like, but embodiments of the present disclosure are not limited thereto.

The second supporting member 1330 may be disposed at a rear surface of the first supporting member 1310. The second supporting member 1330 may be a plate-shaped member which covers the whole rear surface of the first supporting member 1310. For example, the second supporting member 1330 may include at least one or more materials of a glass material, a metal material, and a plastic material, but embodiments of the present disclosure are not limited thereto. For example, the second supporting member 1330 may be an outer plate, a rear plate, a back plate, a back cover, or a rear cover, but embodiments of the present disclosure are not limited thereto.

The supporting member 1300 according to an embodiment of the present disclosure may further include a coupling member 1350. The coupling member 1350 may be disposed between the first supporting member 1310 and the second supporting member 1330. For example, the first supporting member 1310 and the second supporting member 1330 may be coupled or connected to each other by the coupling member 1350. For example, the coupling member 1350 may be an adhesive resin, a double-sided tape, a double-sided foam tape, or a double-sided adhesive foam pad, but embodiments of the present disclosure are not limited thereto. For example, the coupling member 1350 may have elasticity for absorbing an impact, but embodiments of the present disclosure are not limited thereto. As an embodiment of the present disclosure, the coupling member 1350 may be disposed at a whole region between the first supporting member 1310 and the second supporting member 1330. As another embodiment of the present disclosure, the coupling member 1350 may be provided in a mesh structure (or a mesh shape) including an air gap between the first supporting member 1310 and the second supporting member 1330.

The apparatus according to an embodiment of the present disclosure may further include a middle frame 1400.

The middle frame 1400 may be disposed between a rear periphery portion of the display panel 1100 and a front periphery portion of the supporting member 1300. The middle frame 1400 may support one or more of the rear periphery portion of the display panel 1100 and the front periphery portion of the supporting member 1300, respectively, and may surround one or more of side surfaces (or lateral surfaces) of each of the display panel 1100 and the supporting member 1300, respectively. The middle frame 1400 may provide a gap space GS between the display panel 1100 and the supporting member 1300.

According to an embodiment of the present disclosure, the middle frame 1400 may be coupled or connected to the rear periphery portion of the display panel 1100 by a first connection member 1401. The middle frame 1400 may be coupled or connected to the rear periphery portion of the supporting member 1300 by a second connection member 1403.

The apparatus according to an embodiment of the present disclosure may include the panel connection member (or an adhesive member) instead of the middle frame 1400. The panel connection member may be disposed between the rear periphery portion of the display panel 1100 and the front periphery portion of the supporting member 1300 and may provide the gap space GS between the display panel 1100 and the supporting member 1300. The panel connection member may be disposed between the rear periphery portion of the display panel 1100 and the front periphery portion of the supporting member 1300 to adhere the display panel 1100 and the support member 1300. For example, the adhesive layer of the panel connection member (or an adhesive member) may differ from the adhesive layer of the connection member 1150.

As described above, the apparatus (or a display apparatus) according to an embodiment of the present disclosure may output a sound, generated by a vibration of the display panel 1100 based on a vibration of the vibration generating apparatus 1200 disposed at the rear surface of the display panel 1100, to a forward region in front of the display panel 1100 or the apparatus, may concentrate or focus in a specific direction a sound generated based on a vibration of the vibration generating apparatus 1200, and thus, may implement a user's privacy protection function of allowing a sound not to be listened in a periphery region (or an inaudible region) other than a region (or an audible region) in a specific direction.

In FIGS. 16 and 17, it has been described that the vibration generating apparatus 1200 vibrates the display panel 1100 to generate or output a sound, but embodiments of the present disclosure are not limited thereto. For example, the vibration generating apparatus 1200 may vibrate other vibration object (or vibration member) other than the display panel 1100 of the vibration object described above, to generate or output a sound.

Figure 18:
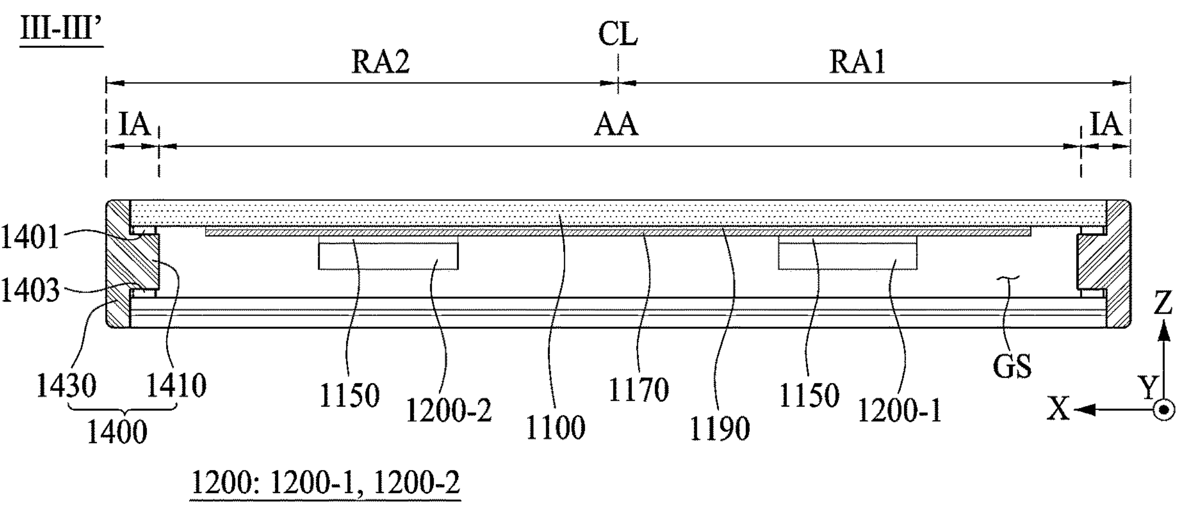
FIG. 18 is another cross-sectional view taken along line III-III' of FIG. 16.

FIG. 18 is another cross-sectional view taken along line illustrated in FIG. 16. FIG. 18 illustrates an embodiment implemented by modifying a vibration generating apparatus illustrated in FIG. 17. Therefore, in the following description, repetitive descriptions of elements other than the vibration generating apparatus and elements relevant thereto may be omitted or will be briefly given.

With reference to FIGS. 16 and 18, in the apparatus according to another embodiment of the present disclosure, a display panel 1100 may include a first rear region RA1 and a second rear region RA2. For example, the first rear region RA1 may be a right rear region, and the second rear region RA2 may be a left rear region. The first and second rear regions RA1 and RA2 may be a left-right symmetrical with respect to a center line CL of the display panel 1100 in a first direction X, but embodiments of the present disclosure are not limited thereto. For example, each of the first and second rear regions RA1 and RA2 may overlap the display area AA of the display panel 1100.

The vibration generating apparatus 1200 according to another embodiment of the present disclosure may include a first vibration generating device 1200-1 and a second vibration generating device 1200-2.

The first vibration generating device 1200-1 may be disposed in the first rear region RA1 of the display panel 1100. A size of the first vibration generating device 1200-1 may have the same size as the first rear area RA1 of the display panel 1100 or may have a size smaller than the first rear area RA1 of the display panel 1100 based on a characteristic of a first sound or a sound characteristic needed for the apparatus. For example, the first vibration generating device 1200-1 may be disposed close to a center or a periphery within the first rear region RA1 of the display panel 1100 with respect to the first direction X.

According to an embodiment of the present disclosure, the first vibration generating device 1200-1 may vibrate the first rear region RA1 of the display panel 1100, and thus, may generate the first sound of at least one of a first vibration sound, a first orientation vibration sound, and a first haptic feedback. For example, the first vibration generating device 1200-1 may directly vibrate the first rear region RA1 of the display panel 1100, and thus, may generate the first sound in the first rear region RA1 of the display panel 1100. For example, the first sound may be a right sound.

The second vibration generating device 1200-2 may be disposed in the second rear region RA2 of the display panel 1100. A size of the second vibration generating device 1200-2 may have the same size as the second rear area RA2 of the display panel 1100 or may have a size smaller than the second rear area RA2 of the display panel 1100 based on a characteristic of the second sound or the sound characteristic needed for the apparatus. For example, the second vibration generating device 1200-2 may be disposed close to a center or a periphery within the second rear region RA2 of the display panel 1100 with respect to the first direction X.

According to an embodiment of the present disclosure, the second vibration generating device 1200-2 may vibrate the second rear region RA2 of the display panel 1100, and thus, may generate the second sound of at least one of a second vibration sound, a second orientation vibration sound, and a second haptic feedback. For example, the second vibration generating device 1200-2 may directly vibrate the second rear region RA2 of the display panel 1100, and thus, may generate the second sound in the second rear region RA2 of the display panel 1100. For example, the second sound may be a left sound.

The first and second vibration generating devices 1200-1 and 1200-2 may have the same size or different sizes to each other based on a sound characteristic of left and right sounds and/or a sound characteristic of the apparatus. And, the first and second vibration generating devices 1200-1 and 1200-2 may be disposed in a left-right symmetrical structure or a left-right asymmetrical structure with respect to the center line CL of the display panel 1100.

Each of the first vibration generating device 1200-1 and the second vibration generating device 1200-2 may include one or more of the vibration apparatus described above with reference to FIGS. 1 to 45, and thus, their repetitive descriptions may be omitted.

Each of the first vibration generating device 1200-1 and the second vibration generating device 200-2 may disposed at the rear surface of the display panel 1100 by the connection member 1150. The connection member 1150 may be substantially the same as the connection member 1150 described above with reference to FIG. 17, and thus, the repetitive description thereof may be omitted.

The apparatus (or a display apparatus) according to another embodiment of the present disclosure may output, through the first vibration generating device 1200-1 and the second vibration generating device 1200-2, a left sound and a right sound to a forward region in front of the display panel 1100, may concentrate or focus in a specific direction a sound generated by a vibration of each of the first vibration generating device 1200-1 and the second vibration generating device 1200-2, and thus, may implement a user's privacy protection function of allowing a sound not to be listened in a periphery region (or an inaudible region) other than a region (or an audible region) in a specific direction.

The apparatus according to another embodiment of the present disclosure may further include a plate 1170 which is disposed between the display panel 1100 and the vibration generating apparatus 1200.

The plate 1170 may have the same shape and size as the rear surface of the display panel 1100, or may have the same shape and size as the vibration generating apparatus 1200. As another embodiment of the present disclosure, the plate 1170 may have a size different from the display panel 1100. For example, the plate 1170 may be smaller than the size of the display panel 1100. As another embodiment of the present disclosure, the plate 1170 may have a size different from the vibration generating apparatus 1200. For example, the plate 1170 may be greater or smaller than the size of the vibration generating apparatus 1200. The vibration generating apparatus 1200 may be the same as or smaller than the size of the display panel 1100.

The plate 1170 may be coupled or connected to the rear surface of the display panel 1100 by a plate coupling member (or a coupling member or a connection member) 1190. Thus, the vibration generating apparatus 1200 may be connected or coupled to a rear surface of the plate 1170 by the connection member 1150, and thus, may be supported by or hung at the rear surface of the plate 1170.

The plate 1170 according to an embodiment of the present disclosure may include a plurality of opening portions. The plurality of opening portions may be configured to have a predetermined size and a predetermined interval. For example, the plurality of opening portions may be formed along a first direction X and a second direction Y so as to have a predetermined size and a predetermined interval. Due to the plurality of opening portions, a sound wave (or a sound pressure) based on a vibration of the vibration generating apparatus 1200 may not be dispersed by the plate 1170, and may concentrate on the display panel 1100. Thus, the loss of a vibration caused by the plate 1170 may be minimized, thereby increasing a sound pressure level characteristic of a sound generated based on a vibration of the display panel 1100 (or a vibration object or a vibration member). For example, the plate 1170 including the plurality of opening portions may have a mesh shape. For example, the plate 1170 including the plurality of opening portions may be a mesh plate.

The plate 1170 according to an embodiment of the present disclosure may include a metal material. For example, the plate 1170 may include any one or more materials of stainless steel, aluminum (Al), a magnesium (Mg), a magnesium (Mg) alloy, a magnesium-lithium (Mg—Li) alloy, and an Al alloy, but embodiments of the present disclosure are not limited thereto. Thus, the plate 1170 may act as a heat plate that dissipates heat occurring in the display panel 1100.

According to an embodiment of the present disclosure, the plate 1170 including a metal material may reinforce a mass of the vibration generating apparatus 1200 which is disposed at or hung from the rear surface of the display panel 1100. Thus, the plate 1170 may decrease a resonance frequency of the vibration generating apparatus 1200 based on an increase in mass of the vibration generating apparatus 1200. Therefore, the plate 1170 may increase a sound characteristic and a sound pressure level characteristic of the low-pitched sound band generated based on a vibration of the vibration generating apparatus 1200 and may enhance the flatness of a sound pressure level characteristic. For example, the flatness of a sound pressure level characteristic may be a magnitude of a deviation between a highest sound pressure level and a lowest sound pressure level. For example, the plate 1170 may be referred to as a weight member, a mass member, a sound planarization member, or the like, but embodiments of the present disclosure are not limited thereto.

A vibration apparatus according to an embodiment of the present disclosure may be applied to a vibration apparatus disposed in an apparatus. The apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game apparatuses, notebook computers, monitors, cameras, camcorders, home appliances, etc. Addition, the vibration apparatus according to an embodiment of the present disclosure may be applied to organic light emitting lighting apparatuses or inorganic light emitting lighting apparatuses. When the vibration apparatus of an embodiment of the present disclosure is applied to lighting apparatuses, the vibration apparatus may act as lighting and a speaker. Addition, when the vibration apparatus of an embodiment of the present disclosure is applied to a mobile device, etc, the vibration apparatus may act as one or more of a speaker, a receiver, and a haptic, but embodiments of the present disclosure are not limited thereto.

An apparatus according to an embodiment of the present disclosure will be described below.

An apparatus according to an embodiment of the present disclosure may comprise a vibration device, the vibration device may comprise a vibration portion including a piezoelectric material, a first electrode portion at a first surface of the vibration portion and configured as a plurality of circular patterns, and a second electrode portion at a second surface different from the first surface of the vibration portion and configured as a single electrode, and the vibration device may generate an ultrasound wave.

According to some embodiments of the present disclosure, the first electrode portion may be provided in plurality, the plurality of first electrode portions may be configured to have the same radius, and a resonance frequency of the vibration device may have one resonance point.

According to some embodiments of the present disclosure, the vibration device may further comprise a line portion at the first surface of the vibration portion, and a pad portion at one side of the vibration portion, and the line portion may connect the first electrode portion to the pad portion.

According to some embodiments of the present disclosure, the vibration apparatus may further comprise a first cover member at a first surface of the vibration device, and a second cover member at a second surface or different from the first surface of the vibration device.

According to some embodiments of the present disclosure, the vibration device may comprise first to fourth regions being configured to drive independently.

According to some embodiments of the present disclosure, the vibration device may comprise a first pad portion at the first region and a plurality of first electrode portions connected to the first pad portion, a second pad portion at the second region and a plurality of first electrode portions connected to the second pad portion, a third pad portion at the third region and a plurality of first electrode portions connected to the third pad portion, and a fourth pad portion at the fourth region and a plurality of first electrode portions connected to the fourth pad portion, and each of the first electrode portions at the first to fourth regions may be electrically disconnected from one another.

According to some embodiments of the present disclosure, the vibration device may further comprise a line portion at the first surface of the vibration portion, and the line portion may respectively connect the first to fourth pad portions to the first electrode portions of the first to fourth regions.

A vibration apparatus according to some embodiments of the present disclosure may comprise a vibration device, the vibration device may comprise a vibration portion including a piezoelectric material, an ultrasound electrode portion at a first surface of the vibration portion and configured as a plurality of circular patterns, a sound electrode portion configured to surround the ultrasound electrode portion, and a second electrode portion at a second surface different from the first surface of the vibration portion and configured as a single electrode, the vibration device may generate a first sound and a second sound, and the first sound may be an ultrasound wave, and the second sound may have an audible frequency.

According to some embodiments of the present disclosure, the ultrasound electrode portion may be provided in plurality, the plurality of ultrasound electrode portions may be configured to have the same radius, and a resonance frequency of the vibration device may have one resonance point.

According to some embodiments of the present disclosure, the vibration device may further comprise a line portion at the first surface of the vibration portion, and an ultrasound pad portion at one side of the vibration portion, and the line portion may connect the ultrasound electrode portion to the ultrasound pad portion.

According to some embodiments of the present disclosure, the vibration apparatus may further comprise a first cover member at the first surface of the vibration device, and a second cover member at a second surface different from the first surface of the vibration device.

According to some embodiments of the present disclosure, the vibration portion may comprise a first vibration portion including a piezoelectric material and overlapping the ultrasound electrode portion, a second vibration portion configured as an organic material portion and surrounding the first vibration portion, and a third vibration portion including a piezoelectric material and overlapping the sound electrode portion.

A vibration apparatus according to some embodiments of the present disclosure may comprise a vibration device, the vibration device may comprise a vibration portion including a piezoelectric material, a first electrode portion having a finger type at a first surface of the vibration portion, and a sound electrode portion having a finger type at a second surface different from the first surface of the vibration portion, the first electrode portion comprises a first engraved pattern, the second electrode portion comprises a second engraved pattern, the first engraved pattern and the second engraved pattern configure a plurality of circular patterns, and the vibration device generates an ultrasound wave.

According to some embodiments of the present disclosure, the plurality of circular patterns may be configured to have the same radius, and a resonance frequency of the vibration device may have one resonance point.

According to some embodiments of the present disclosure, the vibration apparatus may further comprise a first cover member at the first surface of the vibration device, and a second cover member at a second surface different from the first surface of the vibration device.

An apparatus according to some embodiments of the present disclosure may comprise a vibration object, a vibration generating apparatus at the vibration object, and a connection member between the vibration object and the vibration generating apparatus, the vibration generating apparatus may comprise the vibration apparatus described above.

According to some embodiments of the present disclosure, the vibration object may be a display panel including a plurality of pixels configured to display an image, the display panel may comprise a first rear region and a second rear region, and the vibration generating apparatus may comprise a first vibration generating device at the first rear region of the display panel, and a second vibration generating device at the second rear region of the display panel.

According to some embodiments of the present disclosure, the apparatus may further comprise a plate between the vibration object and the vibration generating apparatus.

According to some embodiments of the present disclosure, the vibration object may include one or more of a display panel including a plurality of pixels configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, wood, plastic, glass, metal, cloth, a fiber, paper, rubber, leather, carbon, and a mirror.

It will be apparent to those skilled in the art that various modifications and variations can be made in the vibration apparatus and the sound apparatus including the same of the present disclosure without departing from the technical idea or scope of the disclosures. Thus, it is intended that the present disclosure covers the modifications and variations of this disclosure provided they come within the scope of the appended claims and their equivalents.

What is claimed is:

1. A vibration apparatus, comprising:

a vibration device, wherein the vibration device comprises:

a vibration portion including a piezoelectric material;

an ultrasound electrode portion at a first surface of the vibration portion and configured as a plurality of circular patterns;

a sound electrode portion configured to surround the ultrasound electrode portion; and a second electrode portion at a second surface different from the first surface of the vibration portion and configured as a single electrode, wherein the vibration device generates an ultrasound wave and a second sound having an audible frequency.

2. The vibration apparatus of claim 1, wherein the plurality of circular patterns are configured to have the same radius, and wherein a resonance frequency of the vibration device has one resonance point.

3. The vibration apparatus of claim 1, wherein the vibration device further comprises:

a line portion at the first surface of the vibration portion; and an ultrasound pad portion at one side of the vibration portion, and wherein the line portion connects the ultrasound electrode portion to the ultrasound pad portion.

4. The vibration apparatus of claim 1, further comprising:

a first cover member at the first surface of the vibration device; and a second cover member at a second surface different from the first surface of the vibration device.

5. The vibration apparatus of claim 1, wherein the vibration portion comprises:

a first vibration portion including a piezoelectric material and overlapping the ultrasound electrode portion;

a second vibration portion configured as an organic material portion and surrounding the first vibration portion; and a third vibration portion including a piezoelectric material and overlapping the sound electrode portion.

* * * * *